(12) United States Patent
Kim et al.

(10) Patent No.: US 7,370,252 B2
(45) Date of Patent: May 6, 2008

(54) INTERLEAVING APPARATUS AND METHOD FOR ORTHOGONAL FREQUENCY DIVISION MULTIPLEXING TRANSMITTER

(75) Inventors: Jung Hak Kim, Chunlabook-do (KR); Hun Sik Kang, Daejeon (KR); Do Young Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 346 days.

(21) Appl. No.: 11/129,125

(22) Filed: May 12, 2005

(65) Prior Publication Data
US 2006/0123323 A1    Jun. 8, 2006

(30) Foreign Application Priority Data
Nov. 10, 2004    (KR) .................... 10-2004-0091392

(51) Int. Cl.
*G11C 19/00*    (2006.01)
*G11C 8/00*    (2006.01)
*G06F 12/00*    (2006.01)

(52) U.S. Cl. ............... 714/723; 714/702; 365/230.03; 711/157

(58) Field of Classification Search ............... None
See application file for complete search history.

(56) References Cited

U.S. PATENT DOCUMENTS

| | | | |
|---|---|---|---|
| 5,666,521 A | * | 9/1997 | Marisetty ............. 345/562 |
| 6,035,380 A | * | 3/2000 | Shelton et al. ............. 711/163 |
| 6,714,599 B1 | | 3/2004 | Schlegel et al. |
| 2005/0228962 A1 | * | 10/2005 | Takase et al. ............. 711/168 |

* cited by examiner

*Primary Examiner*—Phung M. Chung
(74) *Attorney, Agent, or Firm*—Blakely, Sokoloff, Taylor & Zafman LLP

(57) ABSTRACT

An interleaving apparatus and method for an OFDM transmitter are provided. The interleaving apparatus comprises a memory unit, a memory write/read control unit, a memory access address generation unit, and a second permutation and output selection unit. The memory unit includes a plurality of memory banks, which are capable of being independently controlled so that data can be written or read in/from the memory banks, each having memory cells arranged in an N×M matrix structure. The memory write/read control unit generates control signals to write/read data in/from the memory unit. The memory access address generation unit generates a memory access address used to write/read data in/from the memory unit in response to the memory write/read control signals. The second permutation and output selection unit rearranges the positions of data bits output from the memory unit and outputs the position-rearranged data bits.

25 Claims, 37 Drawing Sheets

PRIOR ART
FIG. 2

|  3 COLUMNS  | | |
|---|---|---|
| CELL 0 | CELL 8 | CELL 16 |
| CELL 1 | CELL 9 | CELL 17 |
| CELL 2 | CELL 10 | CELL 18 |
| CELL 3 | CELL 11 | CELL 19 |
| CELL 4 | CELL 12 | CELL 20 |
| CELL 5 | CELL 13 | CELL 21 |
| CELL 6 | CELL 14 | CELL 22 |
| CELL 7 | CELL 15 | CELL 23 |

8 ROWS

FIG. 6 a. WRITING OF DATA IN MEMORY UNIT WHEN CONSTELLATION MAPPING SCHEME IS BPSK

24-BIT MEMORY BANK 0

| $0_e$ | $8_e$ | $16_e$ |
|---|---|---|
| $1_e$ | $9_e$ | $17_e$ |
| $2_e$ | $10_e$ | $18_e$ |
| $3_e$ | $11_e$ | $19_e$ |
| $4_e$ | $12_e$ | $20_e$ |
| $5_e$ | $13_e$ | $21_e$ |
| $6_e$ | $14_e$ | $22_e$ |
| $7_e$ | $15_e$ | $23_e$ |

24-BIT MEMORY BANK 1

| $0_o$ | $8_o$ | $16_o$ |
|---|---|---|
| $1_o$ | $9_o$ | $17_o$ |
| $2_o$ | $10_o$ | $18_o$ |
| $3_o$ | $11_o$ | $19_o$ |
| $4_o$ | $12_o$ | $20_o$ |
| $5_o$ | $13_o$ | $21_o$ |
| $6_o$ | $14_o$ | $22_o$ |
| $7_o$ | $15_o$ | $23_o$ | b. READING OF DATA FROM MEMORY UNIT WHEN CONSTELLATION MAPPING SCHEME IS BPSK

24-BIT MEMORY BANK 0

| $0_{e,i,0}$ | $1_{e,i,0}$ | $2_{e,i,0}$ |
|---|---|---|
| $6_{e,i,0}$ | $7_{e,i,0}$ | $8_{e,i,0}$ |
| $12_{e,i,0}$ | $13_{e,i,0}$ | $14_{e,i,0}$ |
| $18_{e,i,0}$ | $19_{e,i,0}$ | $20_{e,i,0}$ |
| $24_{e,i,0}$ | $25_{e,i,0}$ | $26_{e,i,0}$ |
| $30_{e,i,0}$ | $31_{e,i,0}$ | $32_{e,i,0}$ |
| $36_{e,i,0}$ | $37_{e,i,0}$ | $38_{e,i,0}$ |
| $42_{e,i,0}$ | $43_{e,i,0}$ | $44_{e,i,0}$ |

24-BIT MEMORY BANK 1

| $3_{o,i,0}$ | $4_{o,i,0}$ | $5_{o,i,0}$ |
|---|---|---|
| $9_{o,i,0}$ | $10_{o,i,0}$ | $11_{o,i,0}$ |
| $15_{o,i,0}$ | $16_{o,i,0}$ | $17_{o,i,0}$ |
| $21_{o,i,0}$ | $22_{o,i,0}$ | $23_{o,i,0}$ |
| $27_{o,i,0}$ | $28_{o,i,0}$ | $29_{o,i,0}$ |
| $33_{o,i,0}$ | $34_{o,i,0}$ | $35_{o,i,0}$ |
| $39_{o,i,0}$ | $40_{o,i,0}$ | $41_{o,i,0}$ |
| $45_{o,i,0}$ | $46_{o,i,0}$ | $47_{o,i,0}$ | c. READING OF DATA FROM MEMORY CONSTELLATION MAPPING SCHEME IS BPSK (WHEN SUB-CARRIER FREQUENCY ALLOCATION IS CONSIDERED)

24-BIT MEMORY BANK 0

| $24_{e,i,0}$ | $25_{e,i,0}$ | $26_{e,i,0}$ |
|---|---|---|
| $30_{e,i,0}$ | $31_{e,i,0}$ | $32_{e,i,0}$ |
| $36_{e,i,0}$ | $37_{e,i,0}$ | $38_{e,i,0}$ |
| $42_{e,i,0}$ | $43_{e,i,0}$ | $44_{e,i,0}$ |
| $0_{e,i,0}$ | $1_{e,i,0}$ | $2_{e,i,0}$ |
| $6_{e,i,0}$ | $7_{e,i,0}$ | $8_{e,i,0}$ |
| $12_{e,i,0}$ | $13_{e,i,0}$ | $14_{e,i,0}$ |
| $18_{e,i,0}$ | $19_{e,i,0}$ | $20_{e,i,0}$ |

24-BIT MEMORY BANK 1

| $27_{o,i,0}$ | $28_{o,i,0}$ | $29_{o,i,0}$ |
|---|---|---|
| $33_{o,i,0}$ | $34_{o,i,0}$ | $35_{o,i,0}$ |
| $39_{o,i,0}$ | $40_{o,i,0}$ | $41_{o,i,0}$ |
| $45_{o,i,0}$ | $46_{o,i,0}$ | $47_{o,i,0}$ |
| $3_{o,i,0}$ | $4_{o,i,0}$ | $5_{o,i,0}$ |
| $9_{o,i,0}$ | $10_{o,i,0}$ | $11_{o,i,0}$ |
| $15_{o,i,0}$ | $16_{o,i,0}$ | $17_{o,i,0}$ |
| $21_{o,i,0}$ | $22_{o,i,0}$ | $23_{o,i,0}$ |

FIG. 7a d. WRITING OF DATA IN MEMORY
UNIT WHEN CONSTELLATION
MAPPING IS QPSK

24-BIT MEMORY BANK 0

| $0_e$ | $16_e$ | $32_e$ |
|---|---|---|
| $1_e$ | $17_e$ | $33_e$ |
| $2_e$ | $18_e$ | $34_e$ |
| $3_e$ | $19_e$ | $35_e$ |
| $4_e$ | $20_e$ | $36_e$ |
| $5_e$ | $21_e$ | $37_e$ |
| $6_e$ | $22_e$ | $38_e$ |
| $7_e$ | $23_e$ | $39_e$ |

24-BIT MEMORY BANK 6

| $8_e$ | $24_e$ | $40_e$ |
|---|---|---|
| $9_e$ | $25_e$ | $41_e$ |
| $10_e$ | $26_e$ | $42_e$ |
| $11_e$ | $27_e$ | $43_e$ |
| $12_e$ | $28_e$ | $44_e$ |
| $13_e$ | $29_e$ | $45_e$ |
| $14_e$ | $30_e$ | $46_e$ |
| $15_e$ | $31_e$ | $47_e$ |

24-BIT MEMORY BANK 1

| $0_o$ | $16_o$ | $32_o$ |
|---|---|---|
| $1_o$ | $17_o$ | $33_o$ |
| $2_o$ | $18_o$ | $34_o$ |
| $3_o$ | $19_o$ | $35_o$ |
| $4_o$ | $20_o$ | $36_o$ |
| $5_o$ | $21_o$ | $37_o$ |
| $6_o$ | $22_o$ | $38_o$ |
| $7_o$ | $23_o$ | $39_o$ |

24-BIT MEMORY BANK 7

| $8_o$ | $24_o$ | $40_o$ |
|---|---|---|
| $9_o$ | $25_o$ | $41_o$ |
| $10_o$ | $26_o$ | $42_o$ |
| $11_o$ | $27_o$ | $43_o$ |
| $12_o$ | $28_o$ | $44_o$ |
| $13_o$ | $29_o$ | $45_o$ |
| $14_o$ | $30_o$ | $46_o$ |
| $15_o$ | $31_o$ | $47_o$ |

FIG. 7b e. READING OF DATA FROM MEMORY
UNIT WHEN CONSTELLATION
MAPPING SCHEME IS QPSK

24-BIT MEMORY BANK 0

| $0_{e,i,0}$ | $1_{e,i,0}$ | $2_{e,i,0}$ |
|---|---|---|
| $6_{e,i,0}$ | $7_{e,i,0}$ | $8_{e,i,0}$ |
| $12_{e,i,0}$ | $13_{e,i,0}$ | $14_{e,i,0}$ |
| $18_{e,i,0}$ | $19_{e,i,0}$ | $20_{e,i,0}$ |
| $24_{e,i,0}$ | $25_{e,i,0}$ | $26_{e,i,0}$ |
| $30_{e,i,0}$ | $31_{e,i,0}$ | $32_{e,i,0}$ |
| $36_{e,i,0}$ | $37_{e,i,0}$ | $38_{e,i,0}$ |
| $42_{e,i,0}$ | $43_{e,i,0}$ | $44_{e,i,0}$ |

24-BIT MEMORY BANK 6

| $0_{e,q,0}$ | $1_{e,q,0}$ | $2_{e,q,0}$ |
|---|---|---|
| $6_{e,q,0}$ | $7_{e,q,0}$ | $8_{e,q,0}$ |
| $12_{e,q,0}$ | $13_{e,q,0}$ | $14_{e,q,0}$ |
| $18_{e,q,0}$ | $19_{e,q,0}$ | $20_{e,q,0}$ |
| $24_{e,q,0}$ | $25_{e,q,0}$ | $26_{e,q,0}$ |
| $30_{e,q,0}$ | $31_{e,q,0}$ | $32_{e,q,0}$ |
| $36_{e,q,0}$ | $37_{e,q,0}$ | $38_{e,q,0}$ |
| $42_{e,q,0}$ | $43_{e,q,0}$ | $44_{e,q,0}$ |

24-BIT MEMORY BANK 1

| $3_{o,i,0}$ | $4_{o,i,0}$ | $5_{o,i,0}$ |
|---|---|---|
| $9_{o,i,0}$ | $10_{o,i,0}$ | $11_{o,i,0}$ |
| $15_{o,i,0}$ | $16_{o,i,0}$ | $17_{o,i,0}$ |
| $21_{o,i,0}$ | $22_{o,i,0}$ | $23_{o,i,0}$ |
| $27_{o,i,0}$ | $28_{o,i,0}$ | $29_{o,i,0}$ |
| $33_{o,i,0}$ | $34_{o,i,0}$ | $35_{o,i,0}$ |
| $39_{o,i,0}$ | $40_{o,i,0}$ | $41_{o,i,0}$ |
| $45_{o,i,0}$ | $46_{o,i,0}$ | $47_{o,i,0}$ |

24-BIT MEMORY BANK 7

| $3_{o,q,0}$ | $4_{o,q,0}$ | $5_{o,q,0}$ |
|---|---|---|
| $9_{o,q,0}$ | $10_{o,q,0}$ | $11_{o,q,0}$ |
| $15_{o,q,0}$ | $16_{o,q,0}$ | $17_{o,q,0}$ |
| $21_{o,q,0}$ | $22_{o,q,0}$ | $23_{o,q,0}$ |
| $27_{o,q,0}$ | $28_{o,q,0}$ | $29_{o,q,0}$ |
| $33_{o,q,0}$ | $34_{o,q,0}$ | $35_{o,q,0}$ |
| $39_{o,q,0}$ | $40_{o,q,0}$ | $41_{o,q,0}$ |
| $45_{o,q,0}$ | $46_{o,q,0}$ | $47_{o,q,0}$ |

FIG. 7c f. READING OF DATA FROM MEMORY
   UNIT WHEN CONSTELLATION
   MAPPING SCHEME IS QPSK
   (WHEN SUB-CARRIER FREQUENCY
   ALLOCATION IS CONSIDERED)

24-BIT MEMORY BANK 0

| $24_{e,i,0}$ | $25_{e,i,0}$ | $26_{e,i,0}$ |
|---|---|---|
| $30_{e,i,0}$ | $31_{e,i,0}$ | $32_{e,i,0}$ |
| $36_{e,i,0}$ | $37_{e,i,0}$ | $38_{e,i,0}$ |
| $42_{e,i,0}$ | $43_{e,i,0}$ | $44_{e,i,0}$ |
| $0_{e,i,0}$ | $1_{e,i,0}$ | $2_{e,i,0}$ |
| $6_{e,i,0}$ | $7_{e,i,0}$ | $8_{e,i,0}$ |
| $12_{e,i,0}$ | $13_{e,i,0}$ | $14_{e,i,0}$ |
| $18_{e,i,0}$ | $19_{e,i,0}$ | $20_{e,i,0}$ |

24-BIT MEMORY BANK 6

| $24_{e,q,0}$ | $25_{e,q,0}$ | $26_{e,q,0}$ |
|---|---|---|
| $30_{e,q,0}$ | $31_{e,q,0}$ | $32_{e,q,0}$ |
| $36_{e,q,0}$ | $37_{e,q,0}$ | $38_{e,q,0}$ |
| $42_{e,q,0}$ | $43_{e,q,0}$ | $44_{e,q,0}$ |
| $0_{e,q,0}$ | $1_{e,q,0}$ | $2_{e,q,0}$ |
| $6_{e,q,0}$ | $7_{e,q,0}$ | $8_{e,q,0}$ |
| $12_{e,q,0}$ | $13_{e,q,0}$ | $14_{e,q,0}$ |
| $18_{e,q,0}$ | $19_{e,q,0}$ | $20_{e,q,0}$ |

24-BIT MEMORY BANK 1

| $27_{o,i,0}$ | $28_{o,i,0}$ | $29_{o,i,0}$ |
|---|---|---|
| $33_{o,i,0}$ | $34_{o,i,0}$ | $35_{o,i,0}$ |
| $39_{o,i,0}$ | $40_{o,i,0}$ | $41_{o,i,0}$ |
| $45_{o,i,0}$ | $46_{o,i,0}$ | $47_{o,i,0}$ |
| $3_{o,i,0}$ | $4_{o,i,0}$ | $5_{o,i,0}$ |
| $9_{o,i,0}$ | $10_{o,i,0}$ | $11_{o,i,0}$ |
| $15_{o,i,0}$ | $16_{o,i,0}$ | $17_{o,i,0}$ |
| $21_{o,i,0}$ | $22_{o,i,0}$ | $23_{o,i,0}$ |

24-BIT MEMORY BANK 7

| $27_{o,q,0}$ | $28_{o,q,0}$ | $29_{o,q,0}$ |
|---|---|---|
| $33_{o,q,0}$ | $34_{o,q,0}$ | $35_{o,q,0}$ |
| $39_{o,q,0}$ | $40_{o,q,0}$ | $41_{o,q,0}$ |
| $45_{o,q,0}$ | $46_{o,q,0}$ | $47_{o,q,0}$ |
| $3_{o,q,0}$ | $4_{o,q,0}$ | $5_{o,q,0}$ |
| $9_{o,q,0}$ | $10_{o,q,0}$ | $11_{o,q,0}$ |
| $15_{o,q,0}$ | $16_{o,q,0}$ | $17_{o,q,0}$ |
| $21_{o,q,0}$ | $22_{o,q,0}$ | $23_{o,q,0}$ |

FIG. 7d

9. WRITING OF DATA IN MEMORY UNIT
WHEN CONSTELLATION MAPPING SCHEME IS 16-QAM

| 24-BIT MEMORY BANK 0 | | |
|---|---|---|
| $0_e$ | $32_e$ | $64_e$ |
| $1_e$ | $33_e$ | $65_e$ |
| $2_e$ | $34_e$ | $66_e$ |
| $3_e$ | $35_e$ | $67_e$ |
| $4_e$ | $36_e$ | $68_e$ |
| $5_e$ | $37_e$ | $69_e$ |
| $6_e$ | $38_e$ | $70_e$ |
| $7_e$ | $39_e$ | $71_e$ |

| 24-BIT MEMORY BANK 2 | | |
|---|---|---|
| $8_e$ | $40_e$ | $72_e$ |
| $9_e$ | $41_e$ | $73_e$ |
| $10_e$ | $42_e$ | $74_e$ |
| $11_e$ | $43_e$ | $75_e$ |
| $12_e$ | $44_e$ | $76_e$ |
| $13_e$ | $45_e$ | $77_e$ |
| $14_e$ | $46_e$ | $78_e$ |
| $15_e$ | $47_e$ | $79_e$ |

| 24-BIT MEMORY BANK 6 | | |
|---|---|---|
| $16_e$ | $48_e$ | $80_e$ |
| $17_e$ | $49_e$ | $81_e$ |
| $18_e$ | $50_e$ | $82_e$ |
| $19_e$ | $51_e$ | $83_e$ |
| $20_e$ | $52_e$ | $84_e$ |
| $21_e$ | $53_e$ | $85_e$ |
| $22_e$ | $54_e$ | $86_e$ |
| $23_e$ | $55_e$ | $87_e$ |

| 24-BIT MEMORY BANK 8 | | |
|---|---|---|
| $24_e$ | $56_e$ | $88_e$ |
| $25_e$ | $57_e$ | $89_e$ |
| $26_e$ | $58_e$ | $90_e$ |
| $27_e$ | $59_e$ | $91_e$ |
| $28_e$ | $60_e$ | $92_e$ |
| $29_e$ | $61_e$ | $93_e$ |
| $30_e$ | $62_e$ | $94_e$ |
| $31_e$ | $63_e$ | $95_e$ |

| 24-BIT MEMORY BANK 1 | | |
|---|---|---|
| $0_o$ | $32_o$ | $64_o$ |
| $1_o$ | $33_o$ | $65_o$ |
| $2_o$ | $34_o$ | $66_o$ |
| $3_o$ | $35_o$ | $67_o$ |
| $4_o$ | $36_o$ | $68_o$ |
| $5_o$ | $37_o$ | $69_o$ |
| $6_o$ | $38_o$ | $70_o$ |
| $7_o$ | $39_o$ | $71_o$ |

| 24-BIT MEMORY BANK 3 | | |
|---|---|---|
| $8_o$ | $40_o$ | $72_o$ |
| $9_o$ | $41_o$ | $73_o$ |
| $10_o$ | $42_o$ | $74_o$ |
| $11_o$ | $43_o$ | $75_o$ |
| $12_o$ | $44_o$ | $76_o$ |
| $13_o$ | $45_o$ | $77_o$ |
| $14_o$ | $46_o$ | $78_o$ |
| $15_o$ | $47_o$ | $79_o$ |

| 24-BIT MEMORY BANK 7 | | |
|---|---|---|
| $16_o$ | $48_o$ | $80_o$ |
| $17_o$ | $49_o$ | $81_o$ |
| $18_o$ | $50_o$ | $82_o$ |
| $19_o$ | $51_o$ | $83_o$ |
| $20_o$ | $52_o$ | $84_o$ |
| $21_o$ | $53_o$ | $85_o$ |
| $22_o$ | $54_o$ | $86_o$ |
| $23_o$ | $55_o$ | $87_o$ |

| 24-BIT MEMORY BANK 9 | | |
|---|---|---|
| $24_o$ | $56_o$ | $88_o$ |
| $25_o$ | $57_o$ | $89_o$ |
| $26_o$ | $58_o$ | $90_o$ |
| $27_o$ | $59_o$ | $91_o$ |
| $28_o$ | $60_o$ | $92_o$ |
| $29_o$ | $61_o$ | $93_o$ |
| $30_o$ | $62_o$ | $94_o$ |
| $31_o$ | $63_o$ | $95_o$ |

FIG. 7e h. READING OF DATA FROM MEMORY UNIT WHEN CONSTELLATION MAPPING SCHEME IS 16-QAM

| 24-BIT MEMORY BANK 0 | | |
|---|---|---|
| $0_{e,i,0}$ | $1_{e,i,0}$ | $2_{e,i,0}$ |
| $6_{e,i,0}$ | $7_{e,i,0}$ | $8_{e,i,0}$ |
| $12_{e,i,0}$ | $13_{e,i,0}$ | $14_{e,i,0}$ |
| $18_{e,i,0}$ | $19_{e,i,0}$ | $20_{e,i,0}$ |
| $24_{e,i,0}$ | $25_{e,i,0}$ | $26_{e,i,0}$ |
| $30_{e,i,0}$ | $31_{e,i,0}$ | $32_{e,i,0}$ |
| $36_{e,i,0}$ | $37_{e,i,0}$ | $38_{e,i,0}$ |
| $42_{e,i,0}$ | $43_{e,i,0}$ | $44_{e,i,0}$ |

| 24-BIT MEMORY BANK 1 | | |
|---|---|---|
| $3_{o,i,0}$ | $4_{o,i,0}$ | $5_{o,i,0}$ |
| $9_{o,i,0}$ | $10_{o,i,0}$ | $11_{o,i,0}$ |
| $15_{o,i,0}$ | $16_{o,i,0}$ | $17_{o,i,0}$ |
| $21_{o,i,0}$ | $22_{o,i,0}$ | $23_{o,i,0}$ |
| $27_{o,i,0}$ | $28_{o,i,0}$ | $29_{o,i,0}$ |
| $33_{o,i,0}$ | $34_{o,i,0}$ | $35_{o,i,0}$ |
| $39_{o,i,0}$ | $40_{o,i,0}$ | $41_{o,i,0}$ |
| $45_{o,i,0}$ | $46_{o,i,0}$ | $47_{o,i,0}$ |

| 24-BIT MEMORY BANK 2 | | |
|---|---|---|
| $0_{e,i,1}$ | $1_{e,i,1}$ | $2_{e,i,1}$ |
| $6_{e,i,1}$ | $7_{e,i,1}$ | $8_{e,i,1}$ |
| $12_{e,i,1}$ | $13_{e,i,1}$ | $14_{e,i,1}$ |
| $18_{e,i,1}$ | $19_{e,i,1}$ | $20_{e,i,1}$ |
| $24_{e,i,1}$ | $25_{e,i,1}$ | $26_{e,i,1}$ |
| $30_{e,i,1}$ | $31_{e,i,1}$ | $32_{e,i,1}$ |
| $36_{e,i,1}$ | $37_{e,i,1}$ | $38_{e,i,1}$ |
| $42_{e,i,1}$ | $43_{e,i,1}$ | $44_{e,i,1}$ |

| 24-BIT MEMORY BANK 3 | | |
|---|---|---|
| $3_{o,i,1}$ | $4_{o,i,1}$ | $5_{o,i,1}$ |
| $9_{o,i,1}$ | $10_{o,i,1}$ | $11_{o,i,1}$ |
| $15_{o,i,1}$ | $16_{o,i,1}$ | $17_{o,i,1}$ |
| $21_{o,i,1}$ | $22_{o,i,1}$ | $23_{o,i,1}$ |
| $27_{o,i,1}$ | $28_{o,i,1}$ | $29_{o,i,1}$ |
| $33_{o,i,1}$ | $34_{o,i,1}$ | $35_{o,i,1}$ |
| $39_{o,i,1}$ | $40_{o,i,1}$ | $41_{o,i,1}$ |
| $45_{o,i,1}$ | $46_{o,i,1}$ | $47_{o,i,1}$ |

| 24-BIT MEMORY BANK 6 | | |
|---|---|---|
| $0_{e,q,0}$ | $1_{e,q,0}$ | $2_{e,q,0}$ |
| $6_{e,q,0}$ | $7_{e,q,0}$ | $8_{e,q,0}$ |
| $12_{e,q,0}$ | $13_{e,q,0}$ | $14_{e,q,0}$ |
| $18_{e,q,0}$ | $19_{e,q,0}$ | $20_{e,q,0}$ |
| $24_{e,q,0}$ | $25_{e,q,0}$ | $26_{e,q,0}$ |
| $30_{e,q,0}$ | $31_{e,q,0}$ | $32_{e,q,0}$ |
| $36_{e,q,0}$ | $37_{e,q,0}$ | $38_{e,q,0}$ |
| $42_{e,q,0}$ | $43_{e,q,0}$ | $44_{e,q,0}$ |

| 24-BIT MEMORY BANK 7 | | |
|---|---|---|
| $3_{o,q,0}$ | $4_{o,q,0}$ | $5_{o,q,0}$ |
| $9_{o,q,0}$ | $10_{o,q,0}$ | $11_{o,q,0}$ |
| $15_{o,q,0}$ | $16_{o,q,0}$ | $17_{o,q,0}$ |
| $21_{o,q,0}$ | $22_{o,q,0}$ | $23_{o,q,0}$ |
| $27_{o,q,0}$ | $28_{o,q,0}$ | $29_{o,q,0}$ |
| $33_{o,q,0}$ | $34_{o,q,0}$ | $35_{o,q,0}$ |
| $39_{o,q,0}$ | $40_{o,q,0}$ | $41_{o,q,0}$ |
| $45_{o,q,0}$ | $46_{o,q,0}$ | $47_{o,q,0}$ |

| 24-BIT MEMORY BANK 8 | | |
|---|---|---|
| $0_{e,q,1}$ | $1_{e,q,1}$ | $2_{e,q,1}$ |
| $6_{e,q,1}$ | $7_{e,q,1}$ | $8_{e,q,1}$ |
| $12_{e,q,1}$ | $13_{e,q,1}$ | $14_{e,q,1}$ |
| $18_{e,q,1}$ | $19_{e,q,1}$ | $20_{e,q,1}$ |
| $24_{e,q,1}$ | $25_{e,q,1}$ | $26_{e,q,1}$ |
| $30_{e,q,1}$ | $31_{e,q,1}$ | $32_{e,q,1}$ |
| $36_{e,q,1}$ | $37_{e,q,1}$ | $38_{e,q,1}$ |
| $42_{e,q,1}$ | $43_{e,q,1}$ | $44_{e,q,1}$ |

| 24-BIT MEMORY BANK 9 | | |
|---|---|---|
| $3_{o,q,1}$ | $4_{o,q,1}$ | $5_{o,q,1}$ |
| $9_{o,q,1}$ | $10_{o,q,1}$ | $11_{o,q,1}$ |
| $15_{o,q,1}$ | $16_{o,q,1}$ | $17_{o,q,1}$ |
| $21_{o,q,1}$ | $22_{o,q,1}$ | $23_{o,q,1}$ |
| $27_{o,q,1}$ | $28_{o,q,1}$ | $29_{o,q,1}$ |
| $33_{o,q,1}$ | $34_{o,q,1}$ | $35_{o,q,1}$ |
| $39_{o,q,1}$ | $40_{o,q,1}$ | $41_{o,q,1}$ |
| $45_{o,q,1}$ | $46_{o,q,1}$ | $47_{o,q,1}$ |

FIG. 7f i. READING OF DATA FROM MEMORY UNIT WHEN CONSTELLATION MAPPING SCHEME IS 16-QAM
(WHEN SUB-CARRIER FREQUENCY ALLOCATION IS CONSIDERED)

| 24-BIT MEMORY BANK 0 | | | 24-BIT MEMORY BANK 2 | | | 24-BIT MEMORY BANK 6 | | | 24-BIT MEMORY BANK 8 | | |
|---|---|---|---|---|---|---|---|---|---|---|---|
| $24_{e,i,0}$ | $25_{e,i,0}$ | $26_{e,i,0}$ | $24_{e,i,1}$ | $25_{e,i,1}$ | $26_{e,i,1}$ | $24_{e,q,0}$ | $25_{e,q,0}$ | $26_{e,q,0}$ | $24_{e,q,1}$ | $25_{e,q,1}$ | $26_{e,q,1}$ |
| $30_{e,i,0}$ | $31_{e,i,0}$ | $32_{e,i,0}$ | $30_{e,i,1}$ | $31_{e,i,1}$ | $32_{e,i,1}$ | $30_{e,q,0}$ | $31_{e,q,0}$ | $32_{e,q,0}$ | $30_{e,q,1}$ | $31_{e,q,1}$ | $32_{e,q,1}$ |
| $36_{e,i,0}$ | $37_{e,i,0}$ | $38_{e,i,0}$ | $36_{e,i,1}$ | $37_{e,i,1}$ | $38_{e,i,1}$ | $36_{e,q,0}$ | $37_{e,q,0}$ | $38_{e,q,0}$ | $36_{e,q,1}$ | $37_{e,q,1}$ | $38_{e,q,1}$ |
| $42_{e,i,0}$ | $43_{e,i,0}$ | $44_{e,i,0}$ | $42_{e,i,1}$ | $43_{e,i,1}$ | $44_{e,i,1}$ | $42_{e,q,0}$ | $43_{e,q,0}$ | $44_{e,q,0}$ | $42_{e,q,1}$ | $43_{e,q,1}$ | $44_{e,q,1}$ |
| $0_{e,i,0}$ | $1_{e,i,0}$ | $2_{e,i,0}$ | $0_{e,i,1}$ | $1_{e,i,1}$ | $2_{e,i,1}$ | $0_{e,q,0}$ | $1_{e,q,0}$ | $2_{e,q,0}$ | $0_{e,q,1}$ | $1_{e,q,1}$ | $2_{e,q,1}$ |
| $6_{e,i,0}$ | $7_{e,i,0}$ | $8_{e,i,0}$ | $6_{e,i,1}$ | $7_{e,i,1}$ | $8_{e,i,1}$ | $6_{e,q,0}$ | $7_{e,q,0}$ | $8_{e,q,0}$ | $6_{e,q,1}$ | $7_{e,q,1}$ | $8_{e,q,1}$ |
| $12_{e,i,0}$ | $13_{e,i,0}$ | $14_{e,i,0}$ | $12_{e,i,1}$ | $13_{e,i,1}$ | $14_{e,i,1}$ | $12_{e,q,0}$ | $13_{e,q,0}$ | $14_{e,q,0}$ | $12_{e,q,1}$ | $13_{e,q,1}$ | $14_{e,q,1}$ |
| $18_{e,i,0}$ | $19_{e,i,0}$ | $20_{e,i,0}$ | $18_{e,i,1}$ | $19_{e,i,1}$ | $20_{e,i,1}$ | $18_{e,q,0}$ | $19_{e,q,0}$ | $20_{e,q,0}$ | $18_{e,q,1}$ | $19_{e,q,1}$ | $20_{e,q,1}$ |

| 24-BIT MEMORY BANK 1 | | | 24-BIT MEMORY BANK 3 | | | 24-BIT MEMORY BANK 7 | | | 24-BIT MEMORY BANK 9 | | |
|---|---|---|---|---|---|---|---|---|---|---|---|
| $27_{o,i,0}$ | $28_{o,i,0}$ | $29_{o,i,0}$ | $27_{o,i,1}$ | $28_{o,i,1}$ | $29_{o,i,1}$ | $27_{o,q,0}$ | $28_{o,q,0}$ | $29_{o,q,0}$ | $27_{o,q,1}$ | $28_{o,q,1}$ | $29_{o,q,1}$ |
| $33_{o,i,0}$ | $34_{o,i,0}$ | $35_{o,i,0}$ | $33_{o,i,1}$ | $34_{o,i,1}$ | $35_{o,i,1}$ | $33_{o,q,0}$ | $34_{o,q,0}$ | $35_{o,q,0}$ | $33_{o,q,1}$ | $34_{o,q,1}$ | $35_{o,q,1}$ |
| $39_{o,i,0}$ | $40_{o,i,0}$ | $41_{o,i,0}$ | $39_{o,i,1}$ | $40_{o,i,1}$ | $41_{o,i,1}$ | $39_{o,q,0}$ | $40_{o,q,0}$ | $41_{o,q,0}$ | $39_{o,q,1}$ | $40_{o,q,1}$ | $41_{o,q,1}$ |
| $45_{o,i,0}$ | $46_{o,i,0}$ | $47_{o,i,0}$ | $45_{o,i,1}$ | $46_{o,i,1}$ | $47_{o,i,1}$ | $45_{o,q,0}$ | $46_{o,q,0}$ | $47_{o,q,0}$ | $45_{o,q,1}$ | $46_{o,q,1}$ | $47_{o,q,1}$ |
| $3_{o,i,0}$ | $4_{o,i,0}$ | $5_{o,i,0}$ | $3_{o,i,1}$ | $4_{o,i,1}$ | $5_{o,i,1}$ | $3_{o,q,0}$ | $4_{o,q,0}$ | $5_{o,q,0}$ | $3_{o,q,1}$ | $4_{o,q,1}$ | $5_{o,q,1}$ |
| $9_{o,i,0}$ | $10_{o,i,0}$ | $11_{o,i,0}$ | $9_{o,i,1}$ | $10_{o,i,1}$ | $11_{o,i,1}$ | $9_{o,q,0}$ | $10_{o,q,0}$ | $11_{o,q,0}$ | $9_{o,q,1}$ | $10_{o,q,1}$ | $11_{o,q,1}$ |
| $15_{o,i,0}$ | $16_{o,i,0}$ | $17_{o,i,0}$ | $15_{o,i,1}$ | $16_{o,i,1}$ | $17_{o,i,1}$ | $15_{o,q,0}$ | $16_{o,q,0}$ | $17_{o,q,0}$ | $15_{o,q,1}$ | $16_{o,q,1}$ | $17_{o,q,1}$ |
| $21_{o,i,0}$ | $22_{o,i,0}$ | $23_{o,i,0}$ | $21_{o,i,1}$ | $22_{o,i,1}$ | $23_{o,i,1}$ | $21_{o,q,0}$ | $22_{o,q,0}$ | $23_{o,q,0}$ | $21_{o,q,1}$ | $22_{o,q,1}$ | $23_{o,q,1}$ |

FIG. 7g j. WRITING OF DATA IN MEMORY UNIT WHEN CONSTELLATION MAPPING SCHEME IS 64-QAM

FIG. 7h k. READING OF DATA FROM MEMORY UNIT WHEN CONSTELLATION MAPPING SCHEME IS 64-QAM

FIG. 7i

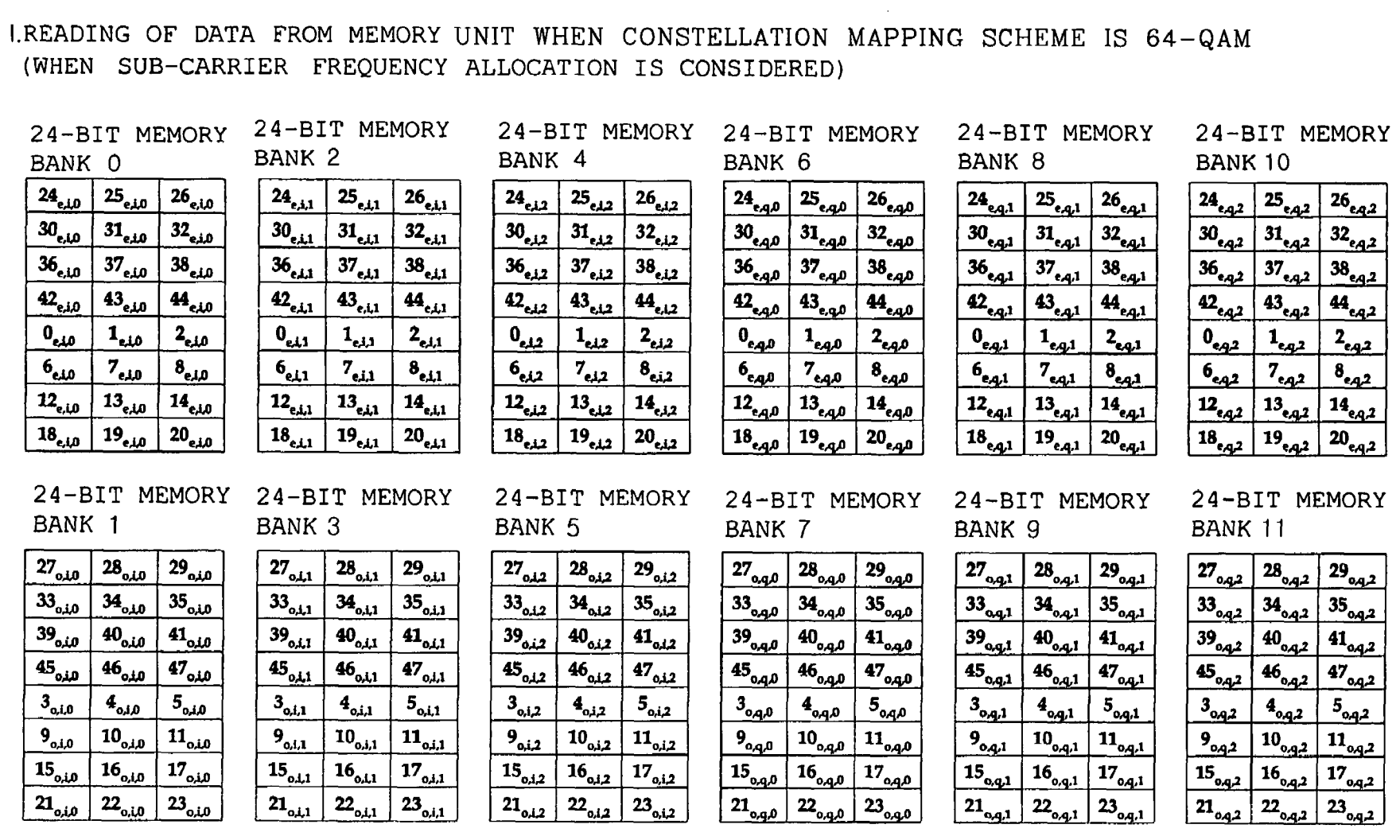

I. READING OF DATA FROM MEMORY UNIT WHEN CONSTELLATION MAPPING SCHEME IS 64-QAM
(WHEN SUB-CARRIER FREQUENCY ALLOCATION IS CONSIDERED)

FIG. 7j

| output_rate_mode[1:0] | even_odd_select | mb_address[2:0] | sp_dout_i_0 | sp_dout_i_1 | sp_dout_i_2 | sp_dout_q_0 | sp_dout_q_1 | sp_dout_q_2 |
|---|---|---|---|---|---|---|---|---|
| "00" (BPSK) | '0' | "xx" | mb_dout_even_i_0 | x | x | x | x | x |
|  | '1' | "xx" | mb_dout_odd_i_0 | x | x | x | x | x |
| "01" (QPSK) | '0' | "xx" | mb_dout_even_i_0 | x | x | mb_dout_even_q_0 | x | x |
|  | '1' | "xx" | mb_dout_odd_i_0 | x | x | mb_dout_odd_q_0 | x | x |
| "10" (16-QAM) | '0' | "xx" | mb_dout_even_i_0 | mb_dout_even_i_1 | x | mb_dout_even_q_0 | mb_dout_even_q_1 | x |
|  | '1' | "xx" | mb_dout_odd_i_1 | mb_dout_odd_i_0 | x | mb_dout_odd_q_1 | mb_dout_odd_q_0 | x |
| "11" (64-QAM) | '0' | "000" | mb_dout_even_i_0 | mb_dout_even_i_1 | mb_dout_even_i_2 | mb_dout_even_q_2 | mb_dout_even_q_0 | mb_dout_even_q_1 |
|  | '1' | "001" | mb_dout_even_i_1 | mb_dout_even_i_2 | mb_dout_even_i_0 | mb_dout_even_q_0 | mb_dout_even_q_1 | mb_dout_even_q_2 |
|  | '0' | "010" | mb_dout_even_i_2 | mb_dout_even_i_0 | mb_dout_even_i_1 | mb_dout_even_q_1 | mb_dout_even_q_2 | mb_dout_even_q_0 |
|  | '1' | "011" | mb_dout_even_i_0 | mb_dout_even_i_1 | mb_dout_even_i_2 | mb_dout_even_q_2 | mb_dout_even_q_0 | mb_dout_even_q_1 |
|  | '0' | "100" | mb_dout_even_i_1 | mb_dout_even_i_2 | mb_dout_even_i_0 | mb_dout_even_q_0 | mb_dout_even_q_1 | mb_dout_even_q_2 |
|  | '1' | "101" | mb_dout_even_i_2 | mb_dout_even_i_0 | mb_dout_even_i_1 | mb_dout_even_q_1 | mb_dout_even_q_2 | mb_dout_even_q_0 |
|  | '0' | "110" | mb_dout_even_i_1 | mb_dout_even_i_2 | mb_dout_even_i_1 | mb_dout_even_q_2 | mb_dout_even_q_0 | mb_dout_even_q_1 |
|  | '1' | "111" | mb_dout_even_i_1 | mb_dout_even_i_2 | mb_dout_even_i_0 | mb_dout_even_q_0 | mb_dout_even_q_1 | mb_dout_even_q_2 |

FIG. 9

| output_rate_mode[1:0] | output_enable | itlv_output_rate_mode[1:0] | itlv_dout_env | itlv_dout_i_0 | itlv_dout_i_1 | itlv_dout_i_2 | itlv_dout_q_0 | itlv_dout_q_1 | itlv_dout_q_2 |
|---|---|---|---|---|---|---|---|---|---|
| "00" (BPSK) | '1' | "00" | '1' | sp_dout_i_0 | '0' | '0' | '0' | '0' | '0' |
| | '0' | MAINTAIN PREVIOUS OUTPUT VALUE | '0' | '0' | '0' | '0' | '0' | '0' | '0' |
| "01" (QPSK) | '1' | "01" | '1' | sp_dout_i_0 | '0' | '0' | sp_dout_q_0 | '0' | '0' |
| | '0' | MAINTAIN PREVIOUS OUTPUT VALUE | '0' | '0' | '0' | '0' | '0' | '0' | '0' |
| "10" (16-QAM) | '1' | "10" | '1' | sp_dout_i_0 | sp_dout_i_1 | '0' | sp_dout_q_0 | sp_dout_q_1 | '0' |
| | '0' | MAINTAIN PREVIOUS OUTPUT VALUE | '0' | '0' | '0' | '0' | '0' | '0' | '0' |
| "11" (64-QAM) | '1' | "11" | '1' | sp_dout_i_0 | sp_dout_i_1 | sp_dout_i_2 | sp_dout_q_0 | sp_dout_q_1 | sp_dout_q_2 |
| | '0' | MAINTAIN PREVIOUS OUTPUT VALUE | '0' | '0' | '0' | '0' | '0' | '0' | '0' |

FIG. 10

| SIGNAL NAME | VALUE (BINARY FORMAT) | DETAILED DESCRIPTION |
|---|---|---|
| mb_ce_0~mb_ce_11 | 1 | INPUT/OUTPUT FOR RESPECTIVE 24-BIT MEMORY BANKS 0 TO 11 IS ACTIVATED. THEREFORE, IT IS POSSIBLE TO WRITE/READ DATA IN/FROM RESPECTIVE MEMORY BANKS IN RESPONSE TO WRITE/READ CONTROL SIGNALS AND MEMORY ACCESS ADDRESSES. |
| | 0 | WRITING OF DATA IN MEMORY BANKS AND READING OF DATA FROM MEMORY BANKS ARE PREVENTED. |
| mb_we_i_0~mb_we_i_2, mb_we_q_0~mb_we_q_2 | 1 | DATA WRITE OPERATION FOR RESPECTIVE MEMORY BANKS IS ACTIVATED. WHEN mb_ce_0 TO mb_ce_11 ARE 1, DATA WRITE OPERATION IS PERFORMED AT RESPECTIVE MEMORY BANKS. |
| | 0 | DATA READ OPERATION FOR RESPECTIVE MEMORY BANKS IS ACTIVATED. WHEN mb_ce_0 TO mb_ce_11 ARE 1, DATA READ OPERATION IS PERFORMED AT RESPECTIVE MEMORY BANKS. |
| output_rate_mode[1:0] | 00 | WHEN CONSTELLATION MAPPING SCHEME RELATED TO DATA TRANSMISSION RATE FOR OUTPUT DATA IS BPSK |
| | 01 | WHEN CONSTELLATION MAPPING SCHEME RELATED TO DATA TRANSMISSION RATE FOR OUTPUT DATA IS QPSK |
| | 10 | WHEN CONSTELLATION MAPPING SCHEME RELATED TO DATA TRANSMISSION RATE FOR OUTPUT DATA IS 16-QAM |
| | 11 | WHEN CONSTELLATION MAPPING SCHEME RELATED TO DATA TRANSMISSION RATE FOR OUTPUT DATA IS 64-QAM |
| output_enable | 1 | SECOND PERMUTATION UNIT OUTPUTS VALID DATA |
| | 0 | SECOND PERMUTATION UNIT DOES NOT OUTPUT VALID DATA |
| eve_odd_select | 1 | ONLY SIGNALS CORRESPONDING TO ODD PART AMONG SIGNALS OUTPUT FROM MEMORY BLOCK ARE VALID |
| | 0 | ONLY SIGNALS CORRESPONDING TO EVEN PART AMONG SIGNALS OUTPUT FROM MEMORY BLOCK ARE VALID |
| 2b_cnt_clear | 1 | 2-BIT BINARY COUNTER IS INITIALIZED TO 0. |
| 2b_cnt_up | 1 | OUTPUT VALUE OF 2-BIT BINARY COUNTER IS INCREASED BY 1 WHEN 2b_cnt_clear IS NOT 1 |
| 3b_cnt_set_value | 100 | THIS VALUE IS USED TO SPECIFY ROW CORRESPONDING TO READ START POINT IN MEMORY BANK WHEN SUB-CARRIER FREQUENCY ALLOCATION IS CONSIDERED. |
| 3b_cnt_clear | 1 | 3-BIT BINARY COUNTER IS INITIALIZED TO 0 |
| 3b_cnt_set | 1 | OUTPUT VALUE OF 3-BIT BINARY COUNTER IS SET TO VALUE INDICATED BY 3b_cnt_set_value[2:0] |
| 3n_cnt_up | 1 | OUTPUT VALUE OF 3-BIT BINARY COUNTER IS INCREASED BY 1 WHEN 3b_cnt_clear IS NOT 1 AND 3b_cnt_set IS NOT 1 |

FIG. 14

INTERLEAVING APPARATUS AND METHOD FOR ORTHOGONAL FREQUENCY DIVISION MULTIPLEXING TRANSMITTER

RELATED APPLICATIONS

The present application is based on, and claims priority from, Korean Application Number 2004-0091392, filed Nov. 10, 2004, the disclosure of which is incorporated by reference herein in its entirety.

BACKGROUND OF THE INVENTION

1. Field of the Invention

The present invention relates, in general, to an interleaving apparatus and method for an orthogonal frequency division multiplexing transmitter and, more particularly, to an interleaving apparatus and method for an orthogonal frequency division multiplexing transmitter, which allows an orthogonal frequency division multiplexing transmitter based on IEEE802.11 standards to be efficiently implemented.

2. Description of the Prior Art

Recently, Internet phones have been activated, and wireless Internet phones, utilizing Wireless Local Area Network (WLAN) technologies based on Institute of Electrical and Electronic Engineers (IEEE) 802.11 standards, have been introduced. An Orthogonal Frequency Division Multiplexing (OFDM) scheme of WlAN technologies is a digital modulation scheme for improving a transmission rate per unit bandwidth and preventing multipath interference, and is a multi-carrier modulation scheme using a plurality of carriers orthogonal to each other.

An example of a typical OFDM transmitter is shown in FIG. 1. Referring to FIG. 1, in the typical OFDM transmitter, the transmission rate of data to be transmitted is set and the data are transmitted to a scrambler 101. Data scrambled by the scrambler 101 are input to an interleaver 103 through a convolution encoder 102. The interleaver 103 interleaves the data, and the interleaved data are mapped by a constellation mapper 104 according to a data transmission rate. The data mapped through the above process are transmitted to a Radio Frequency (RF) converter 108 through an Inverse Fast Fourier Transformer (IFFT) 105, a guard-interval inserter 106 and a symbol wave-shaping filter 107.

In data transmission technology based on OFDM, interleaving is a technology of causing burst errors to appear as random errors distributed to several small locations in consideration of the. fact that a greatly concentrated burst error may occur at a specific location during a process of transmitting data through a transmission medium. A means or device for implementing such an interleaving technology is called an interleaver.

An interleaver executes first and second permutation processes. The first permutation is based on an IEEE 802.11 standards-based permutation equation, $i=(N_{CBPS}/16)(k \bmod 16)+\text{floor}(k/16)$, where $k=0, 1, \ldots, N_{CBPS}-1$. The second permutation is based on an IEEE 802.11 standards-based permutation equation, $j=s\times\text{floor}(i/s)+(i+N_{CBPS}-\text{floor}(16\times i/N_{CBPS})) \bmod s$, where $i=0, 1, \ldots, N_{CBPS}-1$. In the two permutation equations, k represents each bit index of a bit stream before the first permutation, and i represents an index on which a bit, placed on a k-th position before the first permutation, is to be placed after the first permutation. Further, j represents an index on which a bit, placed on an i-th position before the second permutation, is to be placed after the second permutation, and mod represents a modulo operation. Further, floor( ) represents the highest integer that does not exceed the value in parentheses, NCBPS represents the number of encoded bits included in each OFDM symbol, s represents $\max(N_{BPSC}/2,1)$, $N_{BPSC}$ represents the number of encoded bits included in each sub-channel forming an OFDM transmission band, and max( ) represents the highest value selected among the values in parentheses.

When the interleaver is implemented using hardware, it includes memory and an interleaver controller for writing and reading data in and from the memory. According to a mapping scheme related to a data transmission rate based on the standards, the position and sequence in which data are written in the memory and read from the memory are implemented as shown in FIG. 2, so that the first and second permutation processes can be described. FIG. 2 is view showing an example of a memory access scheme to describe an interleaving process. However, FIG. 2 shows only an embodiment to describe the first and second permutations.

As shown in the permutation equations, the size of memory used for permutation varies according to $N_{CBPS}$ and $N_{BPSC}$. $N_{CBPS}$ and $N_{BPSC}$ vary according to mapping schemes, which are classified into four types: Binary Phase Shift Keying (BPSK), Quadrature Phase Shift Keying (QPSK), 16-Quadrature Amplitude Modulation (QAM) and 64-QAM. When the mapping scheme is BPSK, $N_{CBPS}$ is 48 and $N_{BPSC}$ is 1. When the mapping scheme is QPSK, $N_{CBPS}$ is 96 and $N_{BPSC}$ is 2. When the mapping scheme is 16-QAM, $N_{CBPS}$ is 192 and $N_{BPSC}$ is 4. When the mapping scheme is 64-QAM, $N_{CBPS}$ is 288 and $N_{BPSC}$ is 6. Therefore, it can be seen that, in the case of a BPSK mapping scheme, 48-bit memory is used, in the case of a QPSK mapping scheme, 96-bit memory is used, in the case of a 16-QAM mapping scheme, 192-bit memory is used, and, in the case of a 64-QAM mapping scheme, 288-bit memory is used.

Such a conventional interleaver is disadvantageous in that, when data are output from the memory, a subsequent functional block of the interleaver must unnecessarily perform data rearrangement for mapping, or data rearrangement according to sub-carrier frequency allocation. Further, the conventional interleaver is disadvantageous in that, since it does not separately execute first and second permutation processes, the design of a controller for outputting data bits from memory and rearranging the positions of the output data bits is complicated.

In the meantime, an embodiment of an interleaving apparatus disclosed in IEEE 802.11a PHY Specification shows an interleaver having a 1-bit input, 1-bit output structure. This interleaver, which is used to describe first and second permutations, includes single 1-bit writable/readable memory and a memory access address generator, and performs write and read operations corresponding to the first and second permutations on a 1-bit-at-a-time basis.

SUMMARY OF THE INVENTION

The present invention provides an interleaving apparatus and method for an OFDM transmitter, which divides memory for interleaving of the OFDM transmitter into a plurality of memory banks independently controlled so that data are written or read in or from the memory banks, writes data in respective memory banks, outputs data bits in parallel from the memory banks using a read control signal according to mapping schemes to correspond to a first permutation process, and rearranges the positions of the output data bits to correspond to a second permutation process.

The present invention provides an interleaving apparatus for an orthogonal frequency division multiplexing transmitter, comprising a memory unit including a plurality of memory banks each having memory cells arranged in an N×M matrix structure, the memory banks being capable of being independently controlled so that data can be written or read in or from the memory banks; a memory write/read control unit for generating control signals to write/read data in/from the memory unit; a memory access address generation unit for generating a memory access address used to write/read data in/from the memory unit in response to the memory write/read control signals; and a second permutation and output selection unit for rearranging positions of data bits output from the memory unit and outputting the position-rearranged data bits.

Further, the present invention provides an interleaving method for an orthogonal frequency division multiplexing transmitter, the transmitter including a memory write/read control unit and a memory access address generation unit and writing/reading data in/from a memory unit including a plurality of memory banks each having memory cells arranged in a matrix structure, the memory banks being capable of being independently controlled so that data. input from a convolution encoder can be written or read in or from the memory banks, the method comprising the steps of a) the memory write/read control unit generating a control signal to write the input data in a corresponding memory bank in response to data transmission rate and valid interval indication signals for the input data transmitted from the convolution encoder; b) the memory access address generation unit generating a memory access address to access the memory bank, in which the input data are to be written, in response to the write control signal for the memory bank generated by the memory write/read control unit; c) writing the input data in a memory bank corresponding to the memory access address in response to the write control signal generated by the memory write/read control unit; d) the memory write/read control unit generating a control signal to read data, written in the memory bank according to the data transmission rate, and data transmission rate and valid interval indication signals for output data when the data are read from the memory bank; e) the memory access address generation unit generating a memory access address to access the memory bank, from which output data are to be read, in response to the read control signal; f) reading the output data from the memory bank in response to the read control signal and the memory access address; g) rearranging positions of output data read from the memory bank; and h) outputting valid data among the position-rearranged output data in response to the data transmission rate and valid interval indication signals for the output data.

BRIEF DESCRIPTION OF THE DRAWINGS

The above and other objects, features and other advantages of the present invention will be more clearly understood from the following detailed description taken in conjunction with the accompanying drawings, in which:

FIG. 2 illustrates an example of a memory access scheme to describe an interleaving process;

FIG. 6 illustrates a memory bank divided in an 8×3 matrix structure according to an embodiment of the present invention;

FIGS. 7a to 7j illustrate the selection of 24-bit memory banks in the memory unit and data write/read schemes according to constellation mapping schemes related to data transmission rates according to an embodiment of the present invention;

FIG. 9 is a view showing a data input/output method of a second permutation unit according to an embodiment of the present invention;

FIG. 10 is a view showing a data input/output method of an output selection unit according to an embodiment of the present invention;

FIG. 14 is a view defining control and indication signals generated by a memory write/read control unit according to an embodiment of the present invention;

DESCRIPTION OF THE PREFERRED EMBODIMENTS

Figure 1:
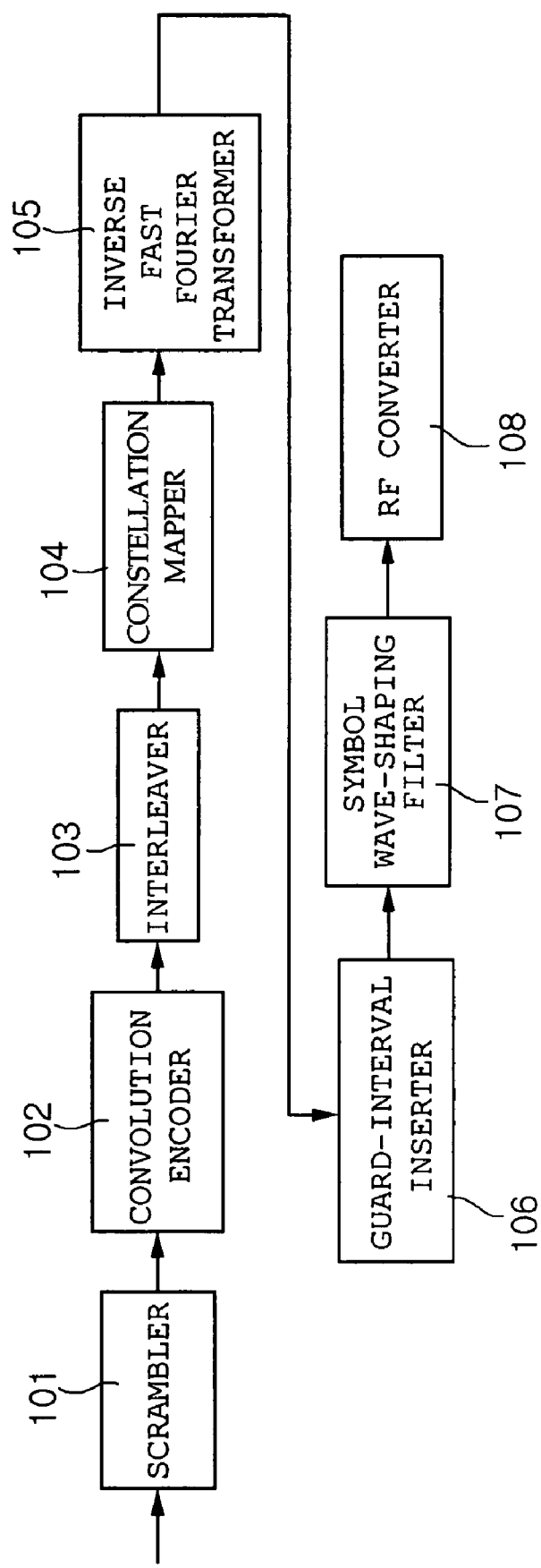
FIG. 1 illustrates an example of a typical OFDM transmitter.

The present invention provides an interleaving apparatus and method to efficiently implement an Orthogonal Frequency Division Multiplexing (OFDM) transmitter based on IEEE 802.11 standards. In the OFDM transmitter, it is efficient to implement a convolution encoder which is a preceding functional block of an interleaving apparatus so that the data output structure of the convolution encoder is a 2-bit parallel structure according to the functional structure thereof. Therefore, when an interleaving apparatus is implemented, it is more reasonable to basically implement a data input structure as a 2-bit parallel structure.

In order to systematically implement an interleaving apparatus for an OFDM transmitter according to the present invention, a constellation mapper, which is a subsequent functional block of the interleaving apparatus, must be considered. The IEEE 802.11 standards-based constellation mapping schemes are classified into four types: BPSK, QPSK, 16-QAM and 64-QAM. Respective mappers differently combine input data bits according to mapping schemes, and output inphase components and quadrature components. Each of the mappers groups the input data into sub-groups of one, two or three bits and maps the bits into predetermined values so as to form respective components. Therefore, if data are separated into inphase components and quadrature components, and the number of bits to be output in parallel is set according to mapping schemes when data are output from the interleaving apparatus in consideration of the mapping scheme, part of processes unnecessarily executed by functional blocks corresponding to the subsequent process of the interleaving apparatus can be omitted.

Therefore, the interleaving apparatus of the present invention provides a method of outputting data bits in parallel from memory through the use of a control signal that is used to read data from the memory for interleaving, according to mapping schemes to correspond to a first permutation, and a method of rearranging the positions of the data bits, output from the memory, to correspond to a second permutation. In this way, the interleaving apparatus of the present invention separates first and second permutations, outputs valid bits in parallel from predetermined memory according to mapping schemes during the first permutation, and rearranges the positions of the output data bits during the second permutation.

In the meantime, the interleaving apparatus of the present invention is operated so that valid data are output in series on a 1-bit-at-a-time basis in the case of BPSK, valid data are output in parallel on a 2-bits-at-a-time basis in the case of QPSK, valid data are output in parallel on a 4-bits-at-a-time basis in the case of 16-QAM, and valid data are output in parallel on a 6-bits-at-a-time basis in the case of 64-QAM, according to mapping schemes related to a data transmission rate.

Preferred embodiments of the present invention are described with reference to the attached drawings below. Reference now should be made to the drawings, in which the same reference numerals are used throughout the different drawings to designate the same or similar components. In the following description of the present invention, detailed descriptions may be omitted if it is determined that the detailed descriptions of related well-known functions and construction may make the gist of the present invention unclear.

Figure 2:
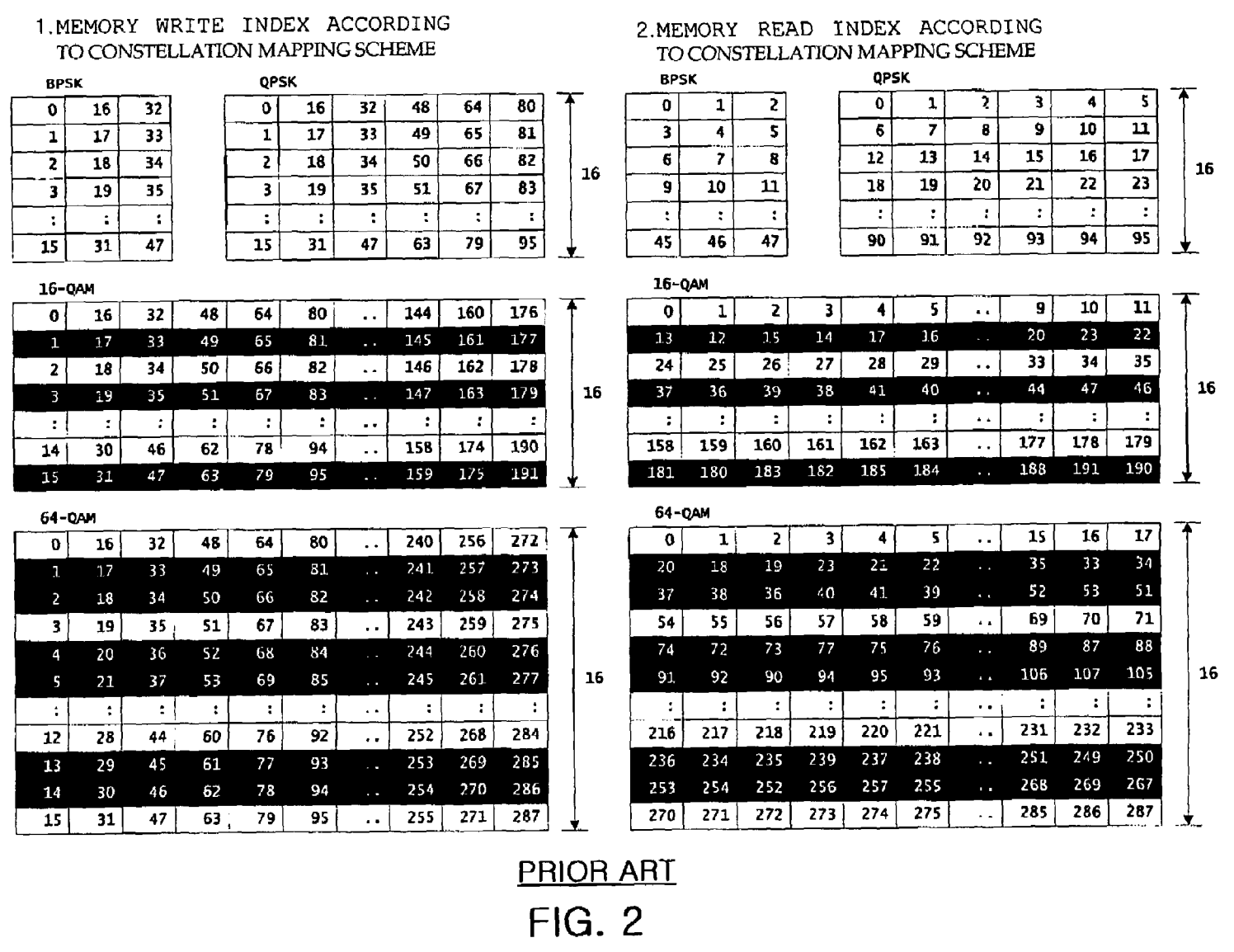
Figure 3:
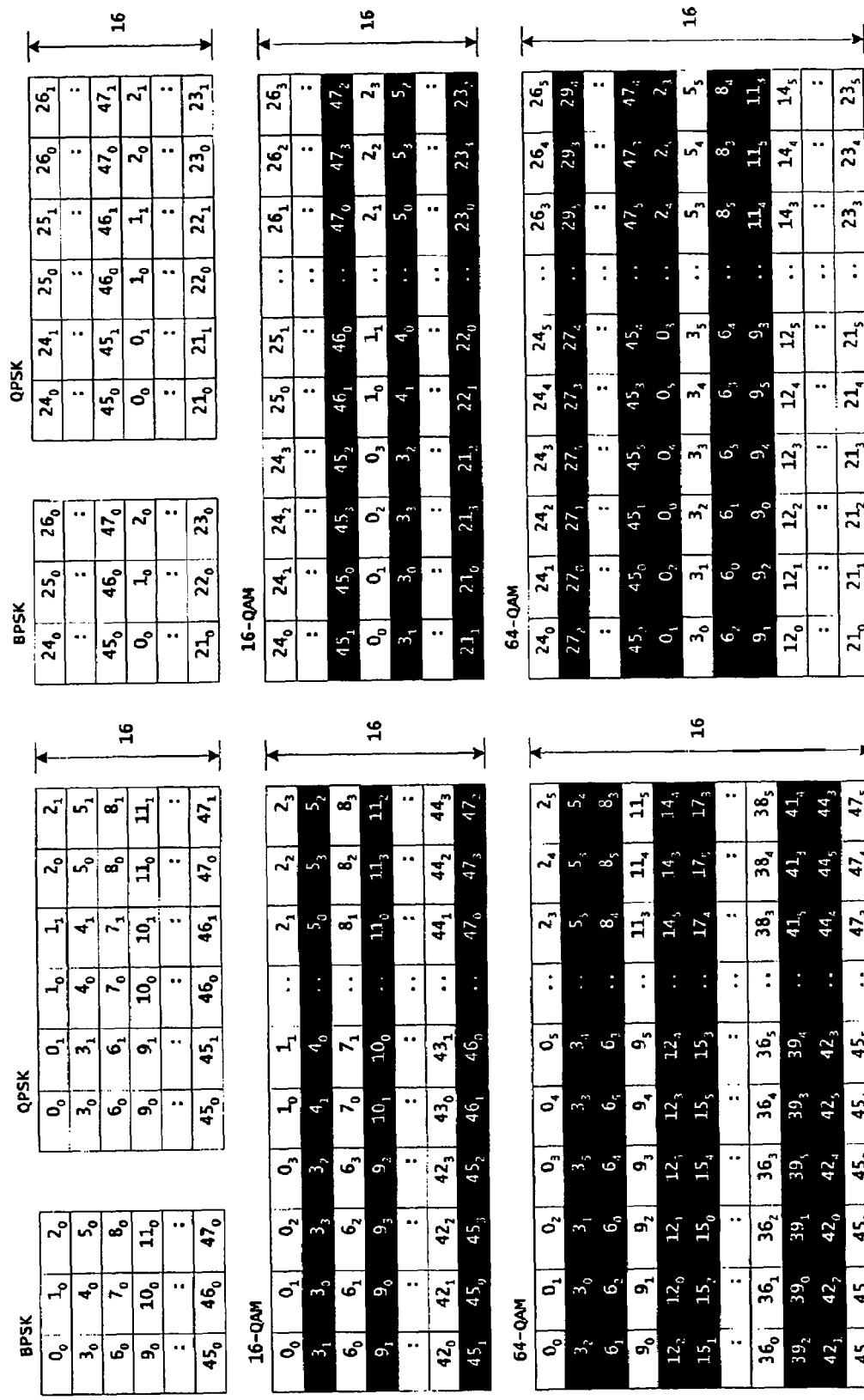
FIGS. 3a and 3b illustrate examples of a method of outputting data written in memory applied to the present invention.

FIGS. 3a and 3b illustrate examples of a method of outputting data written in memory applied to the present invention. Referring to FIGS. 3a and 3b, if it is assumed that an index indicating time or sequence in which data bits are output from an interleaver is n (=0, 1, . . . , 47), and the position of each data bit, output in parallel, is b (=0, 1, 2, 3, 4 or 5), the output index and position of each output data bit are represented by $n_b$. Further, data written in predetermined memory according to the example of the memory access scheme of FIG. 2 can be output using the scheme of FIG. 3a. Further, the written data can also be output using the scheme of FIG. 3b in consideration of sub-carrier frequency allocation based on IEEE 802.11 standards.

Figure 4:
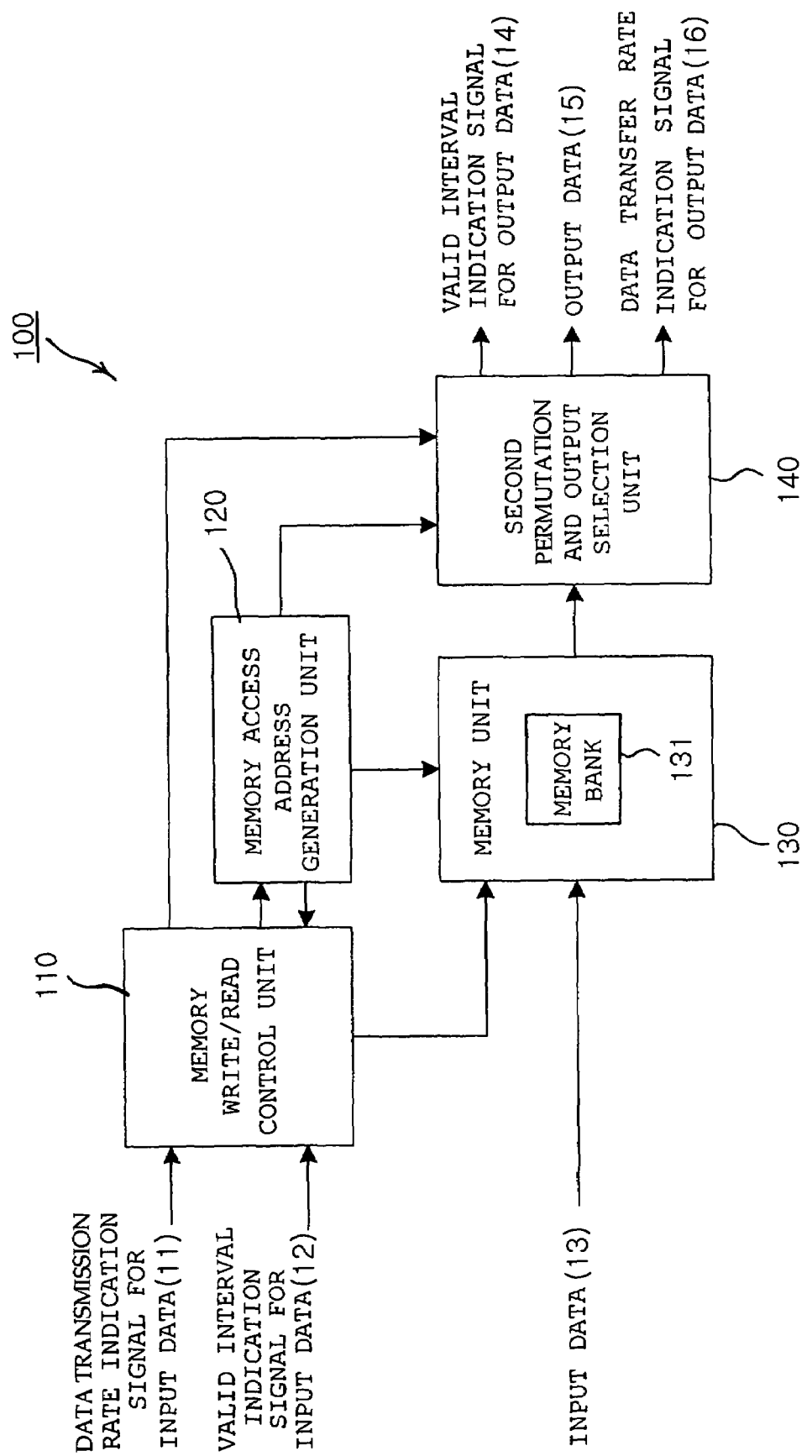
FIG. 4 is a schematic block diagram showing the construction of an interleaving apparatus for an OFDM transmitter according to an embodiment of the present invention.

FIG. 4 is a schematic block diagram showing the construction of an interleaving apparatus for an OFDM transmitter according to an embodiment of the present invention. As shown in FIG. 4, an interleaving apparatus 100 according to an embodiment of the present invention includes a memory unit 130 having a plurality of memory banks 131 each including a plurality of memory cells arranged in an N×M matrix structure, the memory banks 131 being capable of being independently controlled so that input data 13 are written or read in or from the memory banks, a memory write/read control unit 110 for generating control signals used to write/read data in/from the memory unit 130, a memory access address generation unit 120 for generating a memory access address used to write/read data in/from the memory unit 130 in response to the memory write/read control signals, and a second permutation and output selection unit 140 for rearranging the positions of data bits output from the memory unit 130 and outputting the position-rearranged data bits.

Referring to FIG. 4, the memory unit 130 stores the input data 13 therein, and the memory access address generation unit 120 generates the address to access the memory unit 130. That is, the memory unit 130 stores the input data 13 in response to the memory write control signal output from the memory write/read control unit 110. The memory write/read control unit 110 receives a data transmission rate indication signal 11 for the input data 13 and a valid interval indication signal 12 for the input data 13 from an upper-layer system, and writes the data in the memory unit 130 in response to the indication signals 12 and 13. In the case of the write/read control signals for the memory unit 130, the types of activation signals representing writing/reading vary according to the characteristics of memory to be used. Further, the memory write/read control unit 110 controls the memory access address generating unit 120, thus controlling counters used to generate the address to access the memory unit 130. This operation will be described later in detail.

The second permutation and output selection unit 140 rearranges the positions of data bits output from the memory unit 130 using predetermined control signals. That is, the second permutation and output selection unit 140 divides the data output from the memory unit 130 into an odd part and an even part, and outputs valid data from the odd and even parts according to the mapping schemes related to the transmission rate of the output data.

The functional blocks 110 to 140 of FIG. 4 can be easily implemented by those skilled in the art to which the present invention belongs through the use of software, programs, microprocessors, etc.

Figure 5:
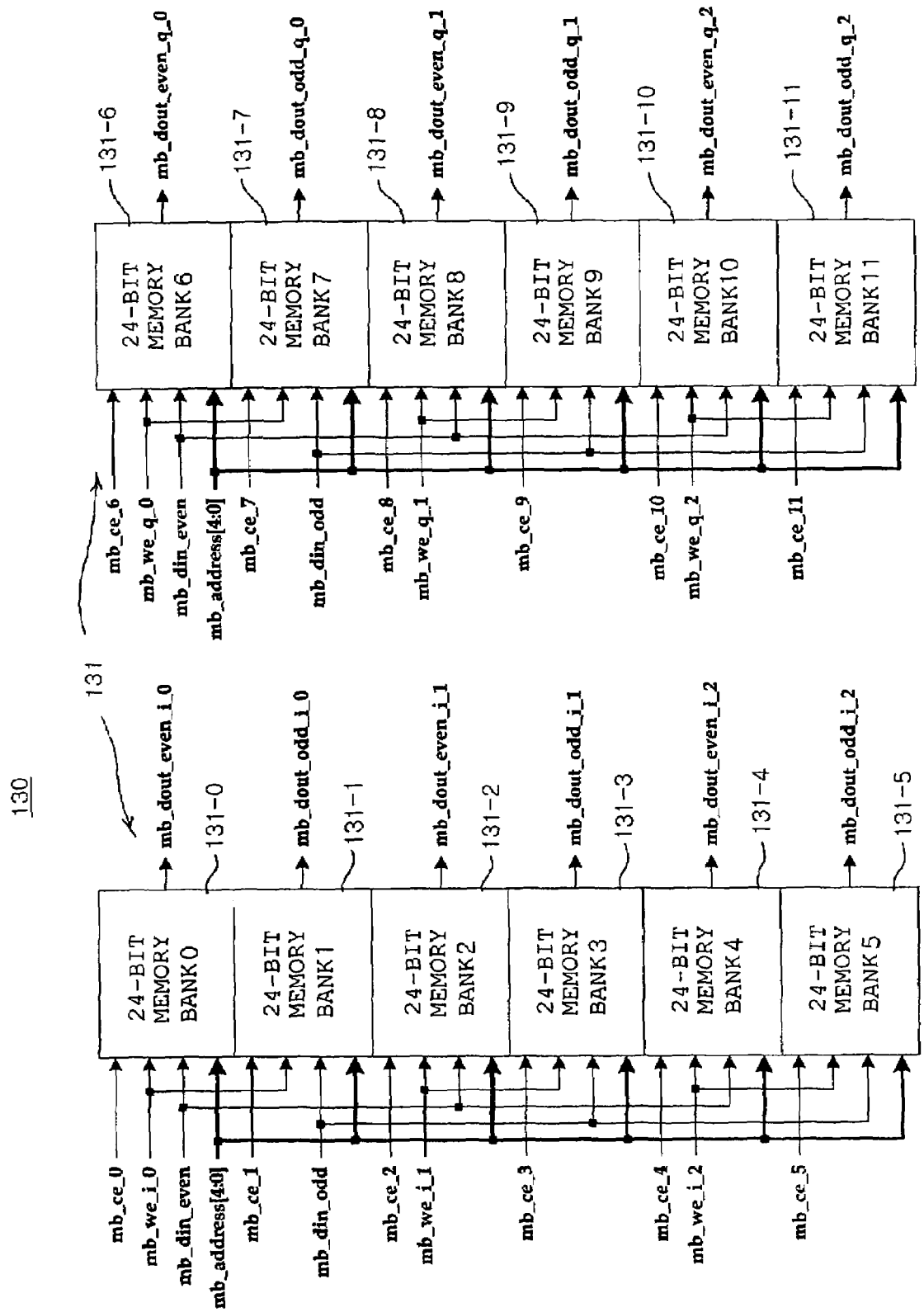
FIG. 5 illustrates a memory unit including 12 24-bit memory banks according to an embodiment of the present invention.

Hereinafter, with reference to FIGS. 5 to 13, the interleaving apparatus of the present invention is described in detail. FIGS. 5 and 6 illustrate memory banks of a memory unit according to an embodiment of the present invention. In detail, FIG. 5 illustrates a memory unit including 12 24-bit memory banks according to an embodiment of the present invention, and FIG. 6 illustrates a memory bank divided in an 8×3 matrix structure according to an embodiment of the present invention. In this case, FIGS. 5 and 6 illustrate a preferred embodiment of the memory unit 130 of the present invention. In another embodiment of the present invention, the number of bits per memory bank and the number of memory banks can vary. In a further embodiment of the present invention, the memory banks can be divided into various matrix structures. These structures can vary with the characteristics of desired OFDM transmitters. Hereinafter, the present invention is described below on the basis of the preferred embodiment of FIGS. 5 and 6.

Referring to the memory unit 130 according to the embodiments of FIGS. 5 and 6, the memory unit 130 includes a total of 12 memory banks 131-0 to 131-11, each being implemented with a memory bank 131 capable of being independently controlled so that data are written or read in or from the memory bank 131. The memory bank 131 is constructed to be able to receive or output one bit at a time. Therefore, a memory access address to access the memory bank 131 is preferably configured in a 5-bit structure. However, the memory access address may have another bit number structure. In order to efficiently execute a first permutation process, each memory bank 131 is divided in a matrix structure with 8 rows and 3 columns according to the embodiment of the present invention, as shown in FIG. 6. An upper 2-bit signal of the 5-bit signal indicating the memory access address specifies the column of memory banks 131 and a lower 3-bit signal thereof specifies the row of the memory banks 131. In this way, if a signal indicating the memory access address is assumed to be mb_address[4:0], mb_address[4:3] indicates a column, mb_address[2:0] indicates a row, and one of the cells depicted in FIG. 5 is accessed by a combination of mb_address[4:3] and mb_address[2:0].

As shown in FIG. 5, the memory banks 131 are paired, and two memory banks, forming each pair, are classified into an odd part and an even part, so that the format of data input to the memory unit 130 is a 2-bit parallel structure. Further, the memory banks 131 are classified into an inphase block and a quadrature block, each including 6 memory banks.

In FIG. 5, mb_din_even denotes even part input data, mb_din_odd denotes odd part input data, mb_address[4:0] denotes a memory access address, mb_ce_0, mb_ce_1, mb_ce_2, mb_ce_3, mb_ce_4, mb_ce_5, mb_ce_6, mb_ce_7, mb_ce_8, mb_ce_9, mb_ce_10, and mb_ce_11 denote input/output activation signals for respective memory banks, mb_we_i_0 denotes a write/read control signal for a memory bank 0 and a memory bank 1, mb_we_i_1 denotes a write/read control signal for a memory bank 2 and a memory bank 3, mb_we_i_2 denotes a write/read control signal for a memory bank 4 and a memory bank 5, mb_we_q_0 denotes a write/read control signal for a memory bank 6 and a memory bank 7, mb_we_q_1 denotes a write/read control signal for a memory bank 8 and a memory bank 9, and mb_we_q_2 denotes a write/read control signal for a memory bank 10 and a memory bank 11, mb_dout_even_i_0 denotes output data of the memory bank 0, mb_dout_odd_i_0 denotes output data of the memory bank 1, mb_dout_even_i_1 denotes output data of the memory bank 2, mb_dout_odd_i_1 denotes output data of the memory bank 3, mb_dout_even_i_2 denotes output data of the memory bank 4, mb_dout_odd_i_2 denotes output data of the memory bank 5, mb_dout_even_q_0 denotes output data of the memory bank 6, mb_dout_odd_q_0 denotes output data of the memory bank 7, mb_dout_even_q_1 denotes output data of the memory bank 8, mb_dout_odd_q_1 denotes output data of the memory bank 9, mb_dout_even_q_2 denotes output data of the memory bank 10, and mb_dout_odd_q_2 denotes output data of the memory bank 11. Terms "even" and "odd" in mb_din_even and mb_din_odd mean an even part and an odd part, respectively. In mb_we_i_0, mb_we_i_1, mb_we_i_2, mb_we_q_0, mb_we_q_1, and mb_we_q_2, denoting the write/read control signals for the memory banks, "i" means the inphase block, "q" means the quadrature block, 0, 1 and 2 mean the positions of corresponding bits when the data bits input to the memory banks are output from the memory unit 130. In the case of the write/read control signals for the memory banks 131, the form of activation signals, indicating writing/reading, varies with the characteristics of the memory banks. That is, if writing is activated when the write/read control signal is "1", reading is activated when the write/read control signal is "0". Further, if reading is activated when the write/read control signal is "0", writing is activated when the write/read control signal is "1". The signals mb_dout_even_i_0, mb_dout_even_i_1, mb_dout_even_i_2, mb_dout_odd_i_0, mb_dout_odd_i_1 and mb_dout_odd_i_2 that are output from the memory banks 131 denote data output corresponding to the inphase block. In this case, "even" means output corresponding to the even part input, and "odd" means output corresponding to the odd part input. In this case, 0, 1 and 2 mean corresponding bit positions when the data bits are output. The signals mb_dout_even_q_0, mb_dout_even_q_1, mb_dout_even_q_2, mb_dout_odd_q_0, mb_dout_odd_q_1, and mb_dout_odd_q_2 denote data output corresponding to the quadrature block. In this case, "even" means output corresponding to the even part input and "odd" means output corresponding to the odd part input. In this case, 0, 1 and 2 mean corresponding bit positions when the data bits are output. When the memory bank input/output activation signals are inactivated, write/read operations are not performed regardless of the status of the write/read control signals.

As described above, the format of data input to the memory unit 130 of the present invention has a 2-bit parallel structure. As shown in the above equation representing the first permutation, when an index for a data bit stream input before the first permutation is analyzed in a temporal or sequential concept, lower bit data temporally precedes upper bit data among the above data, the upper bit data are input to the odd part, and the lower bit data are input to the even part.

In the meantime, as described above, when data are written or read in or from the memory unit 130, the memory access address, output from the memory access address generation unit 120, and the write/read control signals, output from the memory write/read control unit 110, are differently generated, thus executing a first permutation process. The first permutation is executed by controlling the sequence of data written in the memory unit 130, the position of data written in the memory unit 130, the sequence of data read from the memory unit 130 and the position of data read from the memory unit 130 according to mapping schemes related to a data transmission rate, as shown in FIGS. 7a to 7j. FIGS. 7a to 7j illustrate the selection of 24-bit memory banks in the memory unit and data write/read schemes according to mapping schemes related to a data transmission rate according to an embodiment of the present invention. That is, FIGS. 7a to 7j show examples of a relationship between a method of accessing cells in the memory bank 131 and the sequence and position in which data bits to be written are input to the memory unit 130, and a relationship between a method of accessing the cells in the memory bank 131 and the sequence and position in which data bits read from the cells are output from the memory unit 130.

Figure 7H:
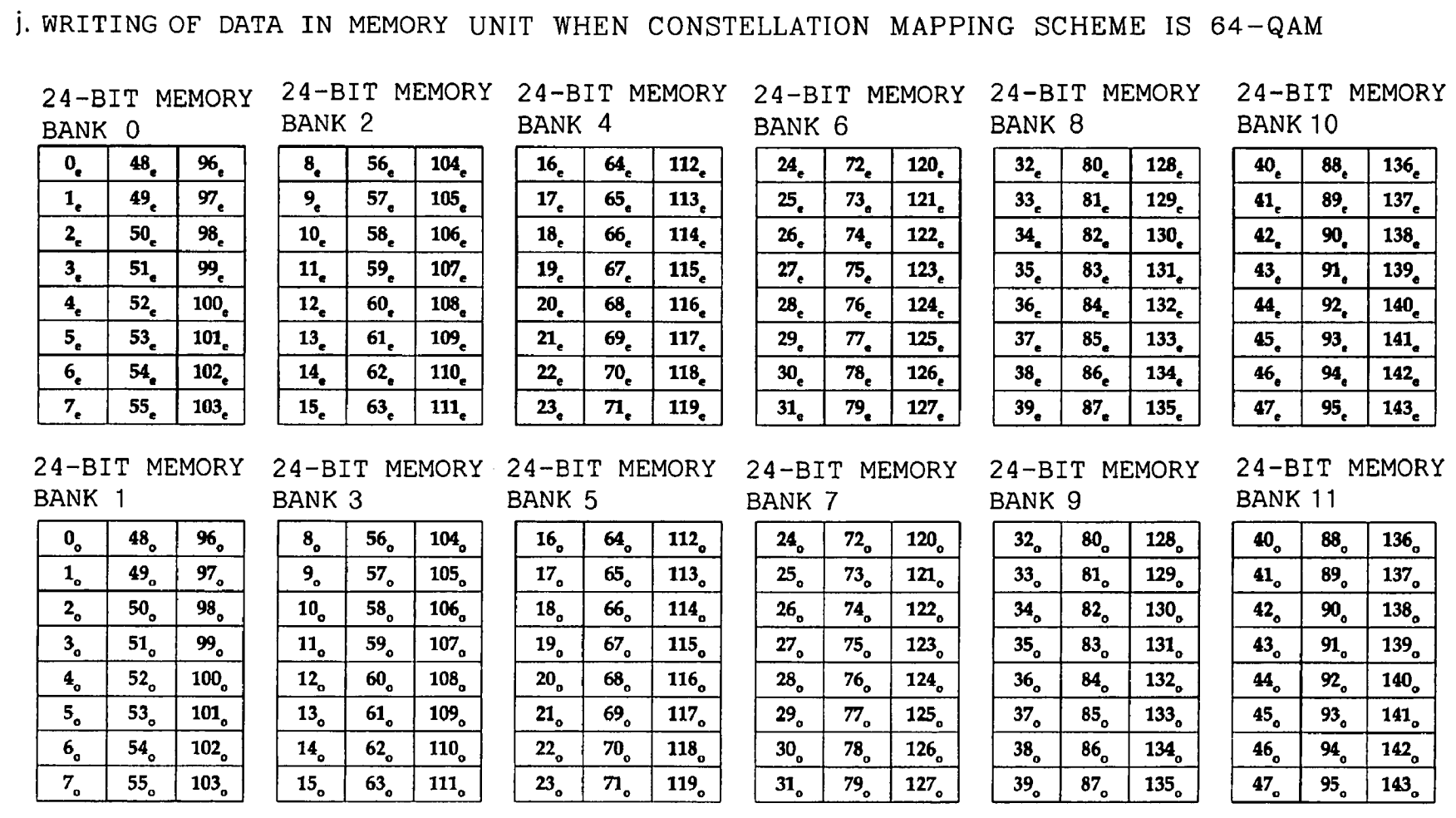

Referring to FIG. 7, an index, indicating the time or sequence of data bits input to the memory unit 130 when the data bits are written in the memory unit 130, is w (=0, 1, ..., 143), the even part and odd part are distinguished from each other by e and o, and the positions of data bits input in parallel on a 2-bits-at-a-time basis are distinguished from each other by e and o. At this time, the input index and position of each data bit input to the memory unit 130 are expressed as $w_e$ and $w_o$, respectively. The relationships between $w_e$ and $w_o$ and the method of accessing the cells in the memory bank 131 are shown in FIGS. 7a to 7j. Further, an index, indicating the time or sequence of data bits output from the memory unit 130 when the data bits are read from the memory unit 130, is r (=0, 1, . . . , 47), the even part and odd part are distinguished from each other by e and o, the inphase block and the quadrature block are distinguished from each other by i and q, and the position of data bits output in parallel from the i and q blocks is p (=0, 1 and 2). In this case, the input index and position of data bits output from the memory unit 130 are expressed as $r_{e,i,p}$, $r_{o,i,p}$, $r_{e,q,p}$ and $r_{o,q,p}$. The relationships between $r_{e,i,p}$, $r_{o,i,p}$, $r_{e,q,p}$ and $r_{o,q,p}$ and the method of accessing the cells in the memory bank 131 are shown in FIGS. 7a to 7j. For example, when a mapping scheme related to a data transmission rate is 16-QAM and the sub-carrier frequency allocation is considered, data bits, which are input to the memory unit and have the sequence and position corresponding to $0_0$, $8_0$, $16_0$ and $24_0$, are written in a cell 0 of a memory bank 1 131-1, a cell 0 of a memory bank 3 131-3, a cell 0 of a memory bank 7 131-7, and a cell 0 of a memory bank 9 131-9, respectively. The sequence and location in which data bits read from the cells are output from the memory unit 130 are $27_{o,i,0}$, $27_{o,i,1}$, $27_{o,q,0}$ and $27_{o,q,1}$, respectively.

In FIGS. 7a to 7j, the usable range of w varies with the mapping schemes. The maximum value of w is 23, 47, 95 and 143 when the mapping scheme is BPSK, QPSK, 16-QAM, and 64-QAM, respectively.

In FIG. 5, the input index and position of data bits input to the memory unit 130 are represented by $w_e$ with respect to mb_din_even, and $w_o$ with respect to mb_din_odd. Further, in FIG. 5, the output index and position of data bits output from the memory unit 130 are represented by $r_{e,i,p}$ with respect to mb_dout_even_i_0, mb_dout_even_i_1 and mb_dout_even_i_2, $r_{o,i,p}$ with respect to mb_dout_odd_i_0, mb_dout_odd_i_1 and mb_dout_odd_i_2, $r_{e,q,p}$ with respect to mb_dout_even_q_0, mb_dout_even_q_1 and mb_dout_even_q_2, and $r_{o,q,p}$ with respect to mb_dout_odd_q_0, mb_dout_odd_q_1 and mb_dout_odd_q_2.

Figure 8:
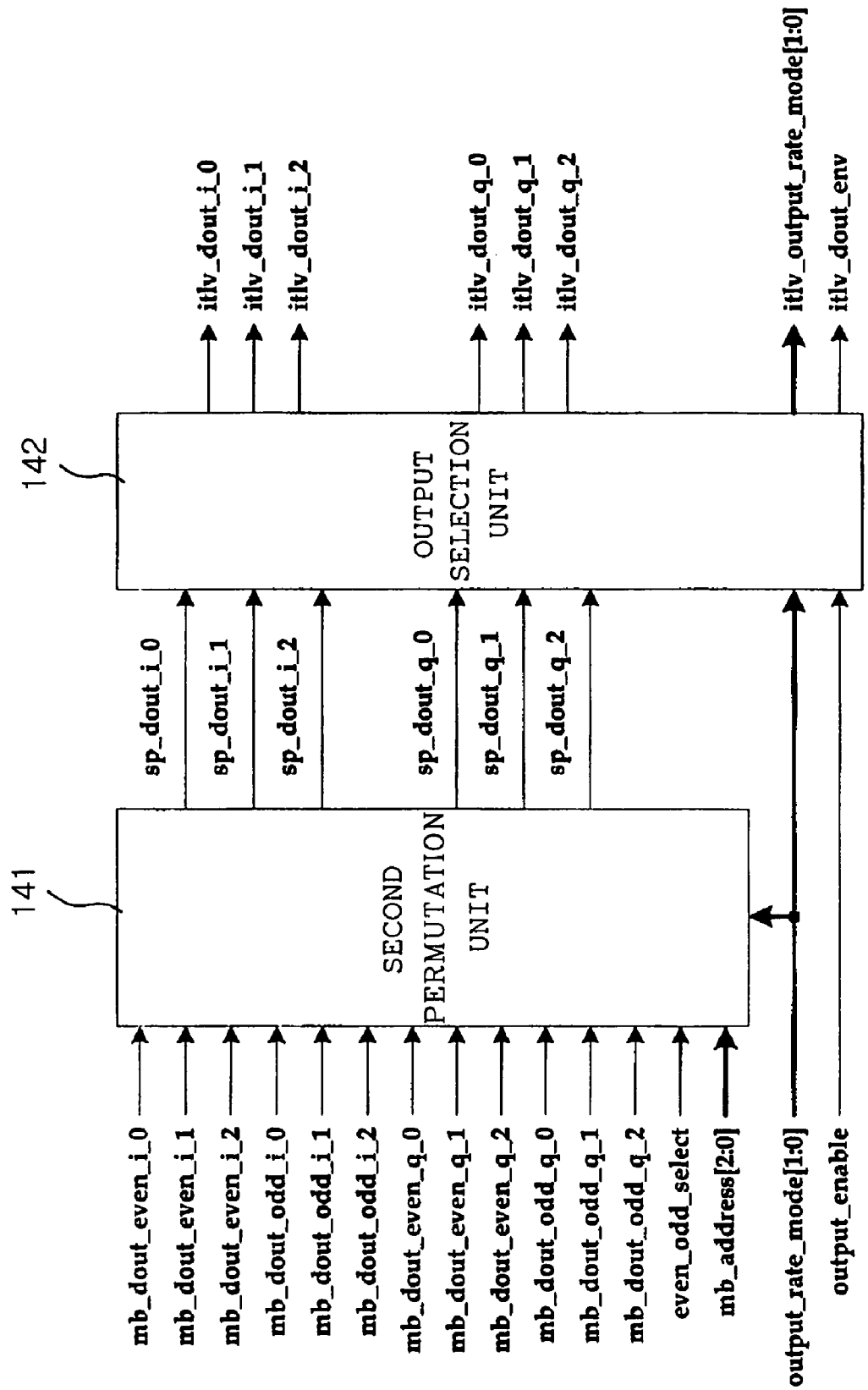
FIG. 8 is a block diagram showing the construction of a second permutation and output selection unit according to an embodiment of the present invention.

FIG. 8 is a block diagram showing the construction of a second permutation and output selection unit according to an embodiment of the present invention. The second permutation and output selection unit 140 of the present invention functions to rearrange the positions of data bits output from the memory unit 130 using predetermined control signals so as to obtain the results shown in FIG. 3. As shown in FIG. 8, the second permutation and output selection unit 140 of the present invention includes a second permutation unit 141 and an output selection unit 142. In FIG. 8, even_odd_select denotes a control signal to distinguish an even part and an odd part from each other with respect to the output of the memory unit 130, output_rate_mode[1:0] denotes a mapping scheme related to a data transmission rate for the data output from the memory unit 130, and output_enable denotes a control signal to indicate the valid interval of data output from the interleaving apparatus. Other input signals of the second permutation unit 141 are the same as the signals input/output to/from the memory unit 130.

In FIG. 8, sp_dout_i_0, sp_dout_i_1 and sp_dout_i_2 denote second permutation results of the data bits output from inphase blocks in the memory unit, and sp_dout_q_0, sp_dout_q_1 and sp_dout_q_2 denote second permutation results of the data bits output from quadrature blocks in the memory unit 130. In a temporal or sequential concept, the second permutation results can be described in the order of sp_dout_i_0, sp_dout_i_1, sp_dout_i_2, sp_dout_q_0, sp_dout_q_1 and sp_dout_q_2, but the output of the second permutation results can be simultaneously performed.

In FIG. 8, itlv_dout_i_0, itlv_dout_i_1 and itlv_dout_i_2 denote the final output of the interleaving apparatus for inphase blocks, and itlv_dout_q_0, itlv_dout_q_1 and itlv_dout_q_2 denote the final output of the interleaving apparatus for quadrature blocks. Further, itlv_output_rate_mode[1:0] denotes a mapping scheme related to a transmission rate of data output from the interleaving apparatus, and itlv_dout_env denotes the valid interval of data output from the interleaving apparatus.

Referring to FIG. 8, the second permutation unit 141 rearranges the output positions of data bits output from the memory unit 130 in response to the signals even_odd_select, output_rate_mode[1:0] and mb_address[2:0], and outputs the position-rearranged data bits. The second permutation results can be output as shown in FIG. 9 when the signals even_odd_select and output_rate_mode[1:0] are implemented so that, if the signal even_odd_select is 0, an even part is selected, while if the signal even_odd_select is 1, an odd part is selected, and if the signal output_rate_mode[1:0] is "00", "01", "10" or "11", a mapping scheme is BPSK, QPSK, 16-QAM or 64-QAM, respectively. In FIG. 8, x means that its value is indefinite. FIG. 9 is a view of a data input/output method performed by the second permutation unit 141 according to an embodiment of the present invention, which shows the second permutation method.

Further, in accordance with mapping schemes related to the transmission rate of output data, the output selection unit 142 outputs valid data on a 1-bit-at-a-time basis when a mapping scheme is BPSK, outputs valid data in parallel on a 2-bits-at-a-time basis when a mapping scheme is QPSK, outputs valid data in parallel on a 4-bits-at-a-time basis when a mapping scheme is 16-QAM, and outputs valid data in parallel on a 6-bits-at-a-time basis when a mapping scheme is 64-QAM. Further, the output selection unit 142 outputs a signal indicating the valid interval of output data, and a signal indicating a mapping scheme related to a data transmission rate. When a signal output_enable is "1", it means that valid data are output. The valid data can be output as shown in FIG. 10 when a mapping scheme is set in such a way that, if the signal output_rate_mode[1:0] is "00", "01", "10" or "11", the mapping scheme is BPSK, QPSK, 16-QAM or 64-QAM, respectively. FIG. 10 is a view of a data input/output method of the output selection unit 142 according to an embodiment of the present invention, which shows a method of outputting valid data according to mapping schemes. In FIG. 10, the value of the signal itlv_output_rate_mode[1:0] varies according to the signal output_rate_mode[1:0] when the signal output_enable is "1", and maintains its previous value when the signal output_enable is "0".

Figure 11:
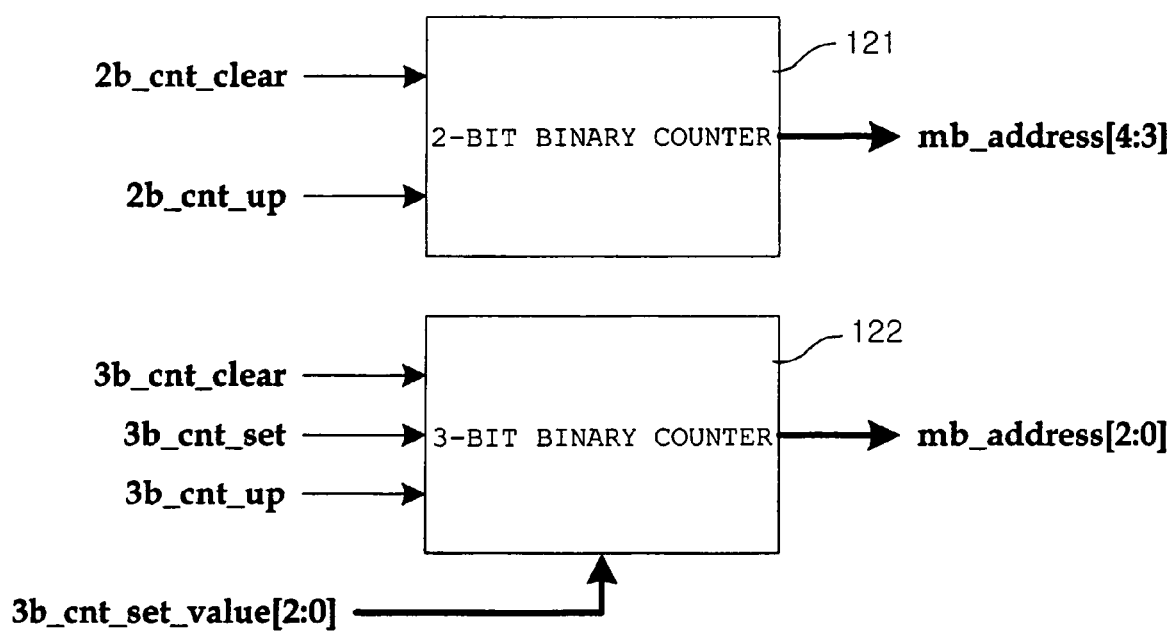
FIG. 11 is a block diagram showing the construction of a memory access address generation unit according to an embodiment of the present invention.

FIG. 11 is a block diagram showing the construction of a memory access address generation unit according to an embodiment of the present invention. As shown in FIG. 11, the memory access address generation unit 120 of the present invention includes a 2-bit binary counter 121 and a 3-bit binary counter 122. As described above, the memory access address generation unit 120 generates a 5-bit memory access address. The 5-bit memory access address is an address to access the memory banks. An upper 2-bit signal of the 5-bit address indicates a "column" of each memory bank having a matrix structure, and a lower 3-bit signal of the 5-bit address indicates a "row" of each memory bank. Further, the upper 2-bit signal is output from the 2-bit binary counter 121, and the lower 3-bit signal is output from the 3-bit binary counter 122.

Referring to FIG. 11, the 2-bit binary counter 121 can count from 0 to 2, and the 3-bit binary counter 122 can count from 0 to 7. Further, the 2-bit binary counter 121 functions as a modulo-2 counter, and the 3-bit binary counter 122 functions as a modulo-7 counter. Therefore, if output values of the counters 121 and 122 are increased by "1" when the output values reach 2 and 7, respectively, the output values of the counters become "0" again. A signal mb_address[4:3] indicating the output of the 2-bit binary counter is equal to a signal indicating the memory bank access address, and increases in the order of "00", "01" and "10". As described above, if the output value of the 2-bit binary counter 121 is increased by "1" when mb_address[4:3] is "10", the mb_address[4:3] becomes "00" again. A signal mb_address[2:0] indicating the output of the 3-bit binary counter 122 is equal to a signal indicating the memory bank access address, and increases in the order of "000", "001", "010", "011", "100", "101", "110" and "111". As described above, if the output value of the 3-bit binary counter 122 is increased by 1 when the mb address[2:0] is "111", the mb address[2:0] becomes "000" again. If a signal 2b_cnt_clear is activated, the 2-bit binary counter 121 is initialized to 0. Further, if a signal 2b_cnt_up is activated, the output value of the 2-bit binary counter 121 is increased by 1. If a signal 3b_cnt_clear is activated, the 3-bit binary counter 122 is initialized to 0. When a signal 3b_cnt_up is activated, the output value of the 3-bit binary counter 122 is increased by 1. If a signal 3b_cnt_set is activated, the output value of the 3-bit binary counter 122 is set to a value indicated by 3b_cnt_set_value [2:0].

Figure 12:
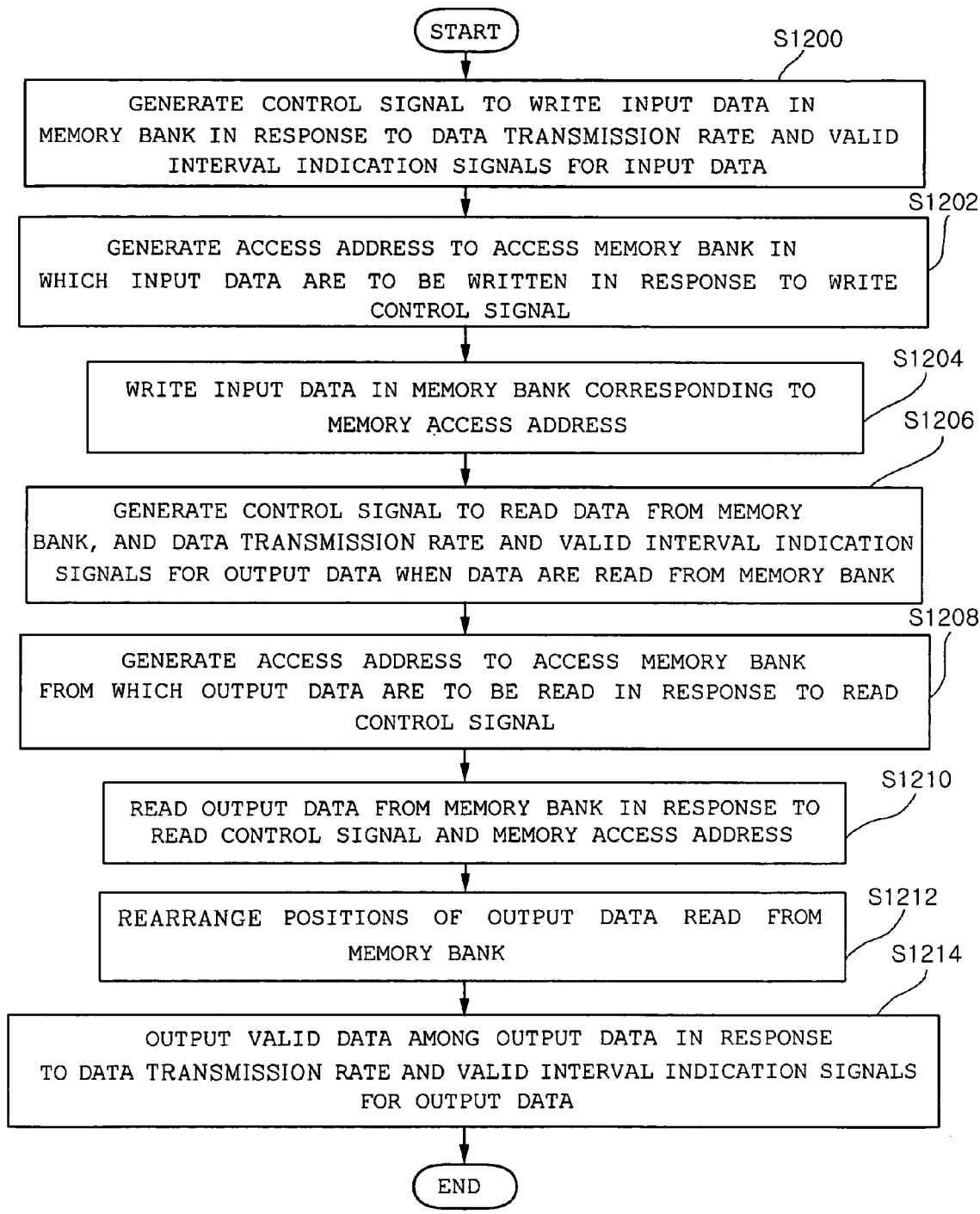
FIG. 12 is a flowchart showing an interleaving method for an OFDM transmitter according to an embodiment of the present invention.

FIG. 12 is a flowchart showing an interleaving method for an OFDM transmitter according to an embodiment of the present invention. The flowchart of FIG. 12 can be preferably implemented in the interleaving apparatus for the OFDM transmitter. With reference to the above drawings and FIG. 12, the interleaving method for the OFDM transmitter of the present invention is described. First, as described above, the OFDM transmitter includes a memory write/read control unit 110 for generating control signals to write/read data in/from memory, a memory access address generation unit 120 for generating a memory access address used to write/read data in/from the memory, and a memory unit 130 including a plurality of memory banks 131 each having memory cells arranged in a matrix structure, the memory banks 131 being capable of being independently controlled so that input data received from the convolution encoder 102 are written or read in or from the memory banks 131. With reference to FIG. 12, the interleaving method for the OFDM transmitter according to the present invention is described. The memory write/read control unit 110 generates a control signal to write input data 13, transmitted from the convolution encoder 102, in the memory bank 131 in response to data transmission rate and valid interval indication signals 11 and 12 for the input data 13 at step S1200. The memory access address generation unit 120 generates a memory access address to access the memory bank 131 in which the input data 13 are to be written in response to the write control signal for the memory bank 131 generated by the memory write/read control unit 110 at step S1202. Then, the input data 13 are written in the memory bank 131 corresponding to the memory access address in response to the write control signal generated by the memory write/read control unit 110 at step S1204. The memory write/read control unit 110 generates a control signal to read data, written in the memory bank 131 in response to the data transmission rate indication signal 11, and data transmission rate and valid interval indication signals 16 and 14 for data 15 to be output at the time of reading the data at step S1206. The memory access address generation unit 120 generates a memory access address to access the memory bank 131, from which the data to be read are output, in response to the read control signal at step S1208. The output data 15 are read from the memory bank 131 in response to the read control signal and the memory access address at step S1210. The positions of the output data 15 read from the memory bank 131 are rearranged at step S1212. Thereafter, valid data are output among the output data, the positions of which have been rearranged, according to the data transmission rate and valid interval indication signals 16 and 14 for the output data 15 at step S1214. In this case, although not shown in the drawings, the data transmission rate and valid interval indication signals 16 and 14 for the output data 15 are also preferably output at step S1214.

In the meantime, the memory write/read control unit 110 generates the write/read control signals, controls the counters that generate the memory access address, controls the arrangement of the output position of data bits output from the memory unit 130 for the purpose of a second permutation, and arranges the number of valid bits to be output from the interleaving apparatus according to the mapping schemes related to a data transmission rate. The data transmission rate indication signal for the input data 13, input to the memory write/read control unit 110, indicates a mapping scheme related to the transmission rate of data input to the memory bank 131.

Figure 13:
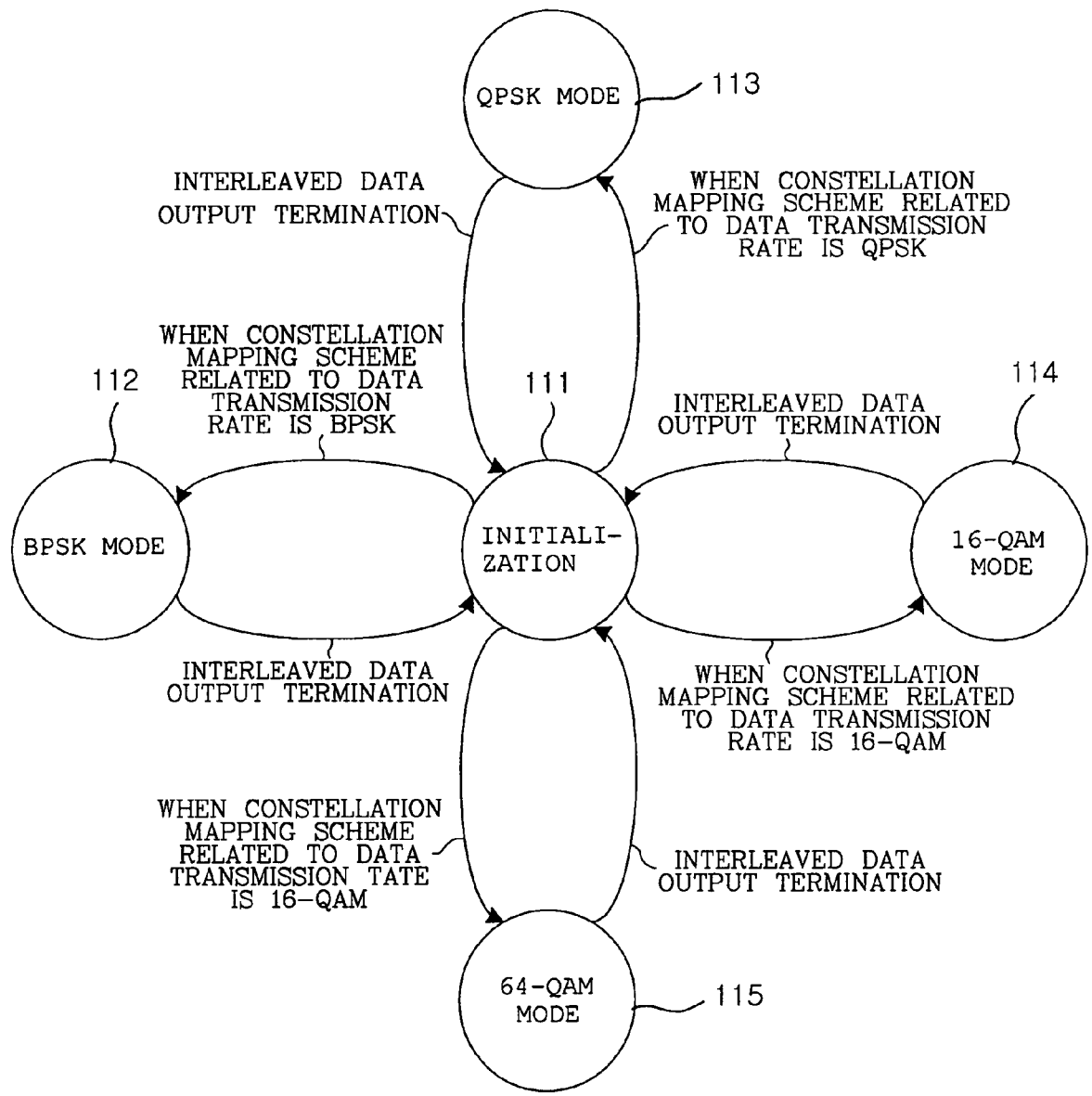
FIG. 13 is a state diagram showing signals of a memory write/read control unit according to constellation mapping schemes related to data transmission rates according to an embodiment of the present invention.

FIG. 13 is a state diagram showing signals of a memory write/read control unit according to mapping schemes related to a data transmission rate according to an embodiment of the present invention. With reference to FIG. 13, the operation according to various states of the memory write/read control unit 110 of the present invention is described. First, in order to describe the detailed operation of the memory write/read control unit 110, the control and indication signals are defined as shown in FIG. 14. FIG. 14 is a view defining control and indication signals generated by the memory write/read control unit 110 according to an embodiment of the present invention. With reference to FIGS. 13 and 14, the memory write/read control unit 110 of the present invention is described.

Referring to FIG. 13, at an initialization state 111, the memory bank input/output activation signals are inactivated to prevent the write/read operation with respect to the memory unit 130, the 3-bit binary counter 122 and the 2-bit binary counter 121 are initialized, and the valid interval indication signal for output data is inactivated because valid data to be output do not exist. If the valid interval indication signal for input data of FIG. 4 is not activated, the initialization state is maintained. If the valid interval indication signal for input data is activated at the same time that the data are input to the interleaving apparatus, and the mapping scheme related to a data transmission rate for the input data is BPSK, the current state is changed to a BPSK mode 112. If the valid interval indication signal for input data is activated at the same time that the data are input to the interleaving apparatus, and the mapping scheme related to a data transmission rate for the input data is QPSK, the current state is changed to a QPSK mode 113. If the valid interval indication signal for input data is activated at the same time that the data are input to the interleaving apparatus, and the mapping scheme related to a data transmission rate for the input data is 16-QAM, the current state is changed to a 16-QAM mode 114. If the valid interval indication signal for input data is activated at the same time that the data are input to the interleaving apparatus, and the mapping scheme related to a data transmission rate for the input data is 64-QAM, the current state is changed to a 64-QAM mode 115.

Figure 15A:
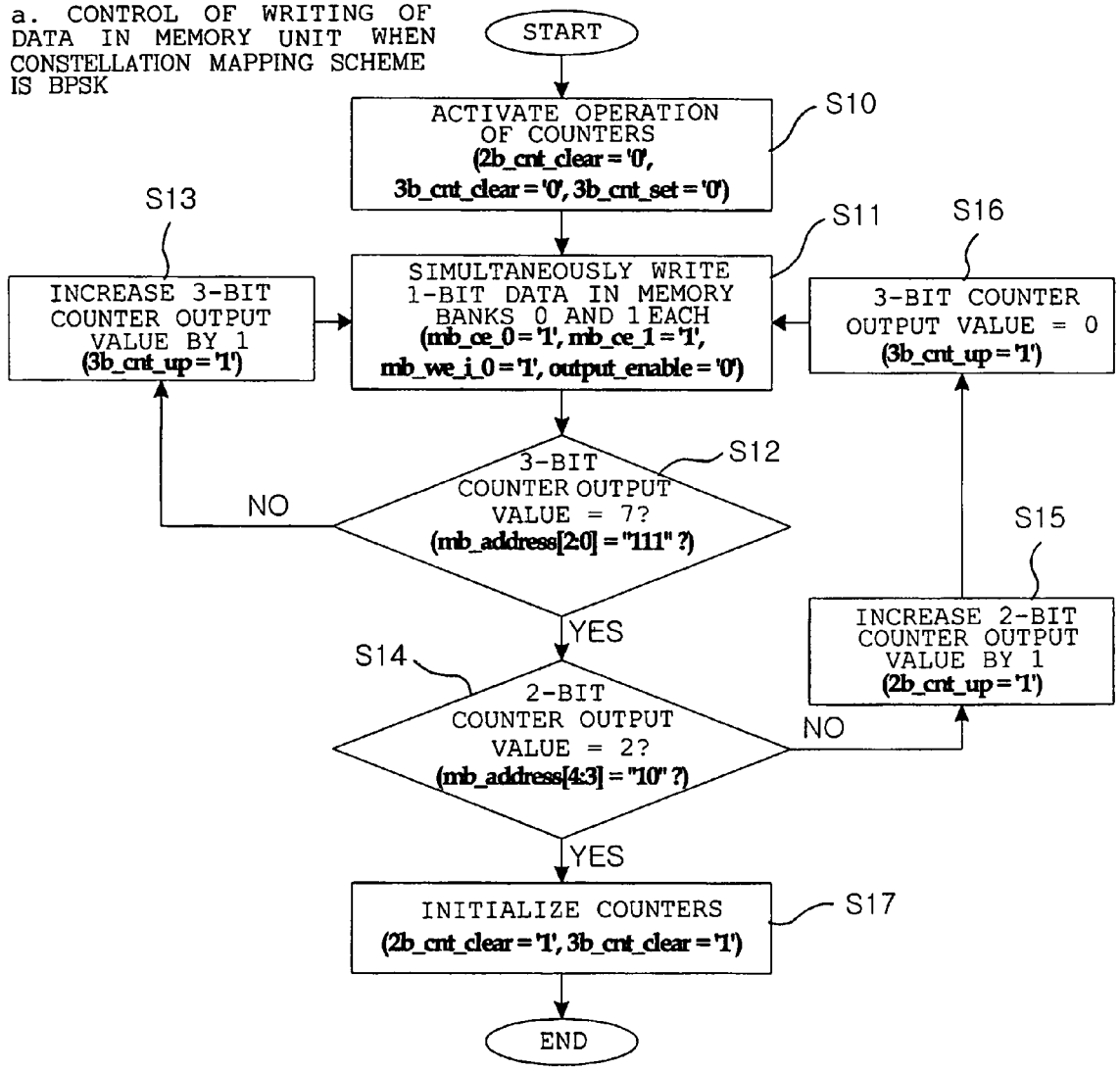
FIGS. 15a to 15c are flowcharts showing the operation of the memory write/read control unit when a constellation mapping scheme related to a data transmission rate is BPSK according to an embodiment of the present invention.
Figure 15B:
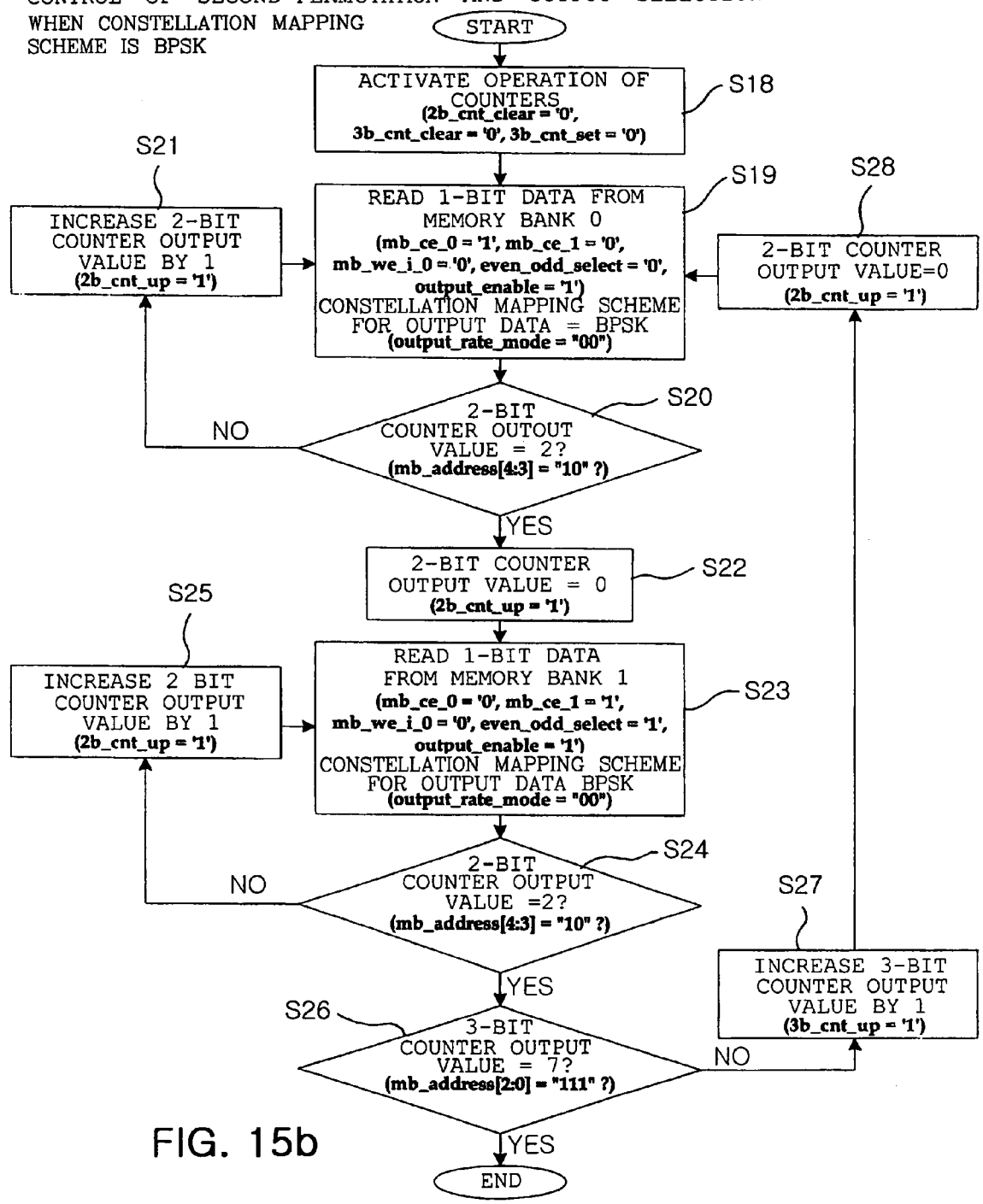
Figure 15C:
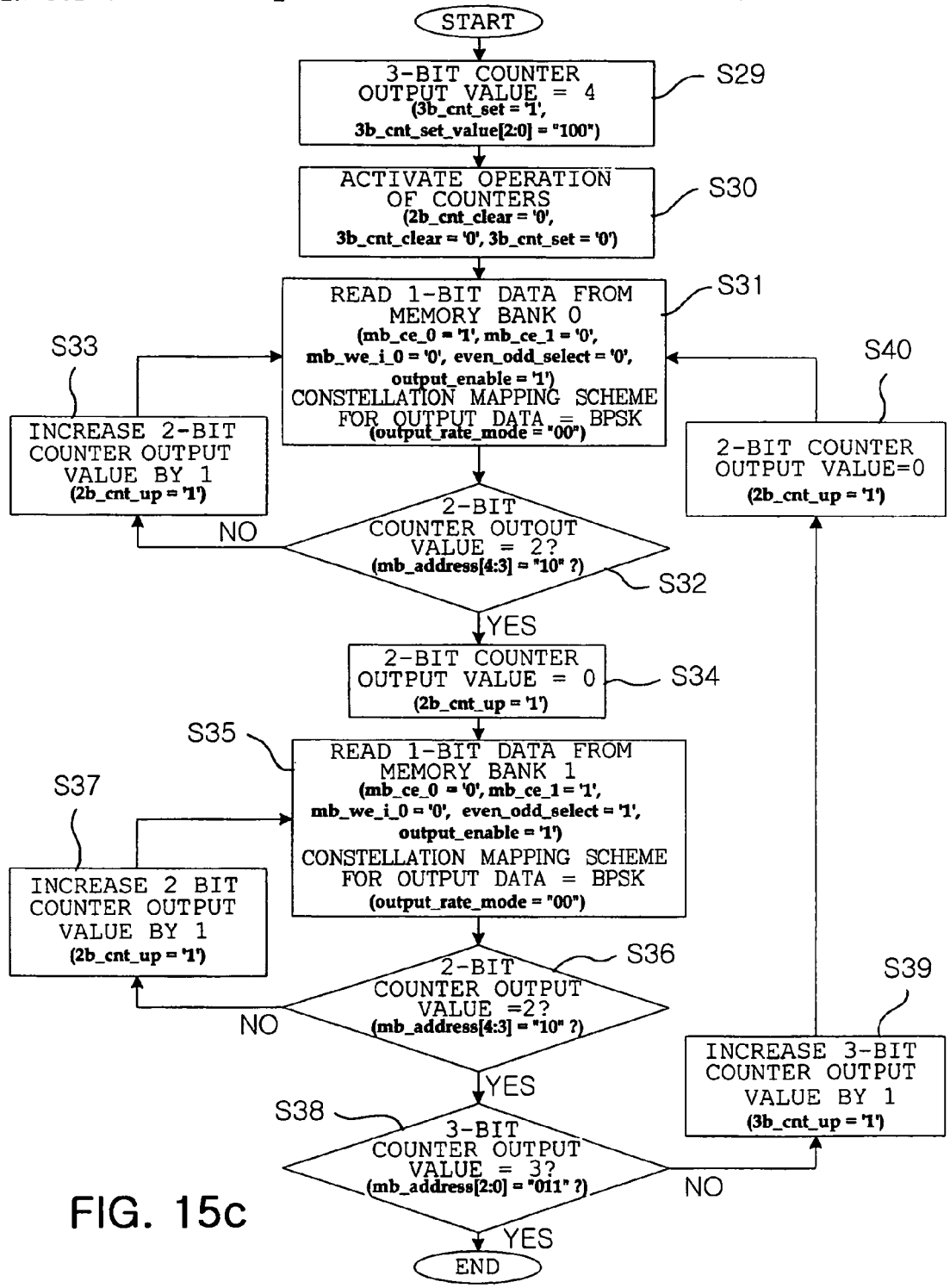

In FIG. 13, in the BPSK mode 112, the permutation processes are executed using the 24-bit memory banks 0 and 1, as shown in FIGS. 7a to 7j. A detailed operation performed in the BPSK mode is shown in FIGS. 15a to 15c. As shown in FIGS. 15a to 15c, the detailed operation of the BPSK mode may vary in the case where the sub-carrier frequency allocation is considered.

Figure 16A:
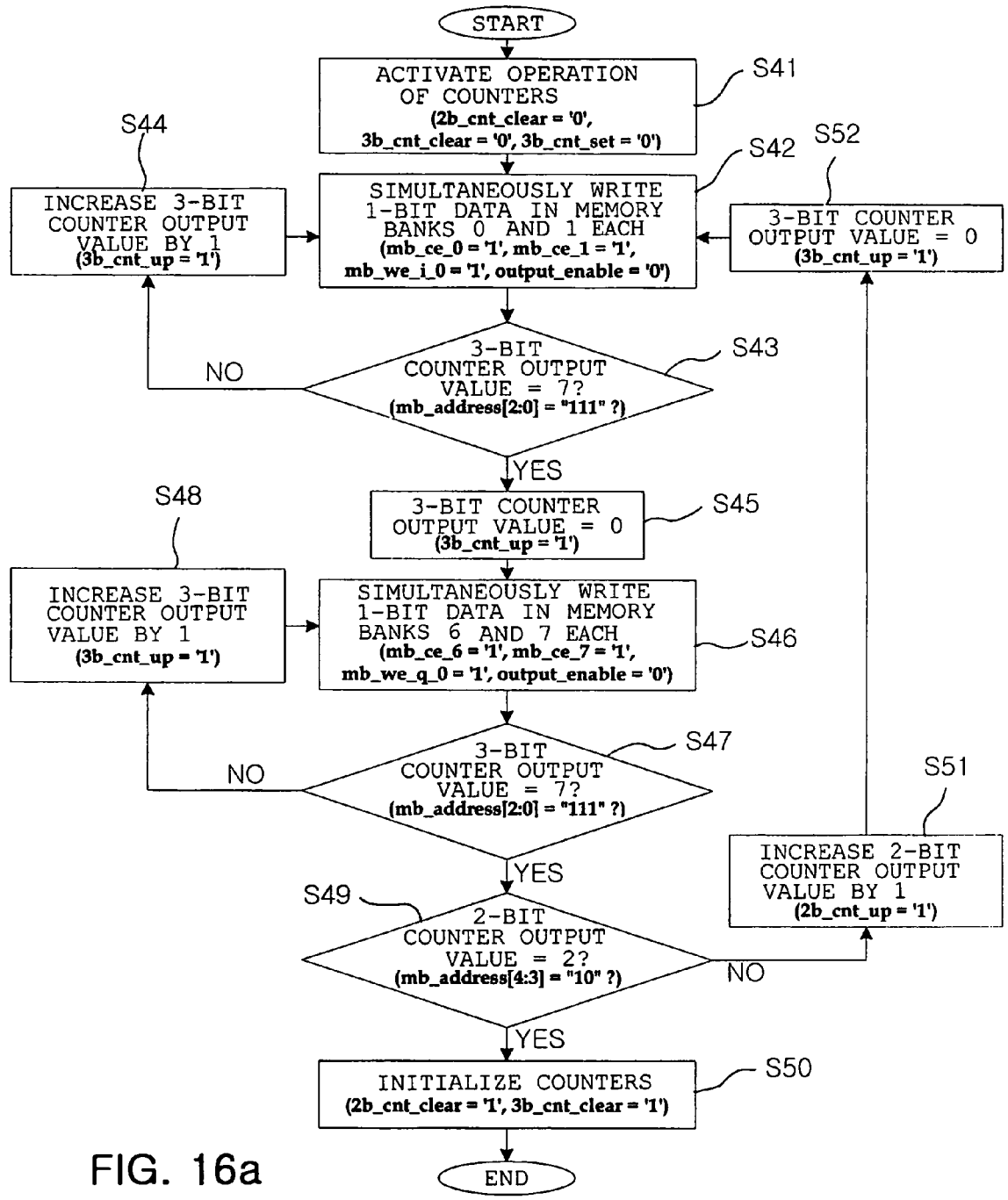
FIGS. 16a to 16c are flowcharts showing the operation of the memory write/read control unit when a constellation mapping scheme related to a data transmission rate is QPSK according to an embodiment of the present invention.
Figure 16B:
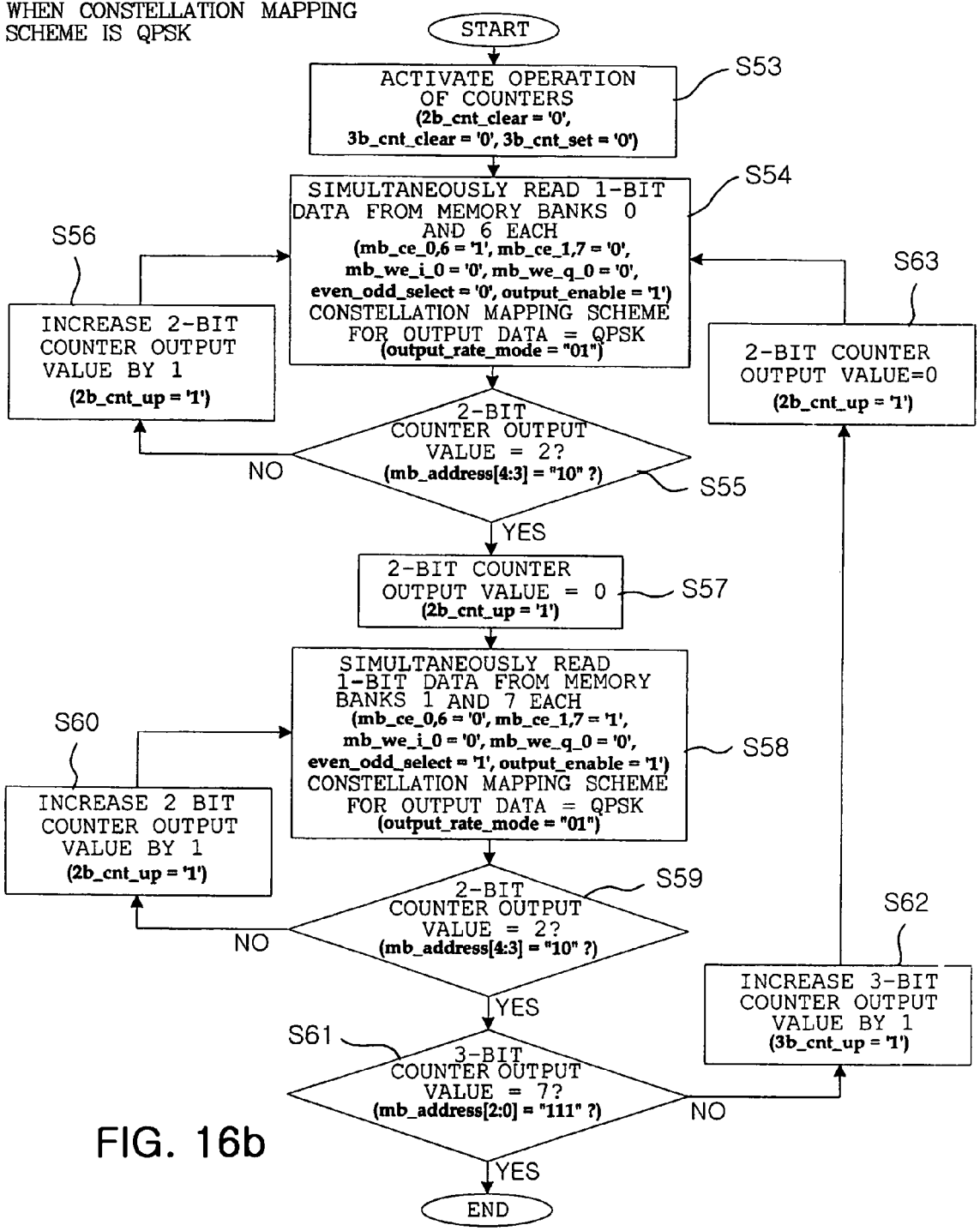
Figure 16C:
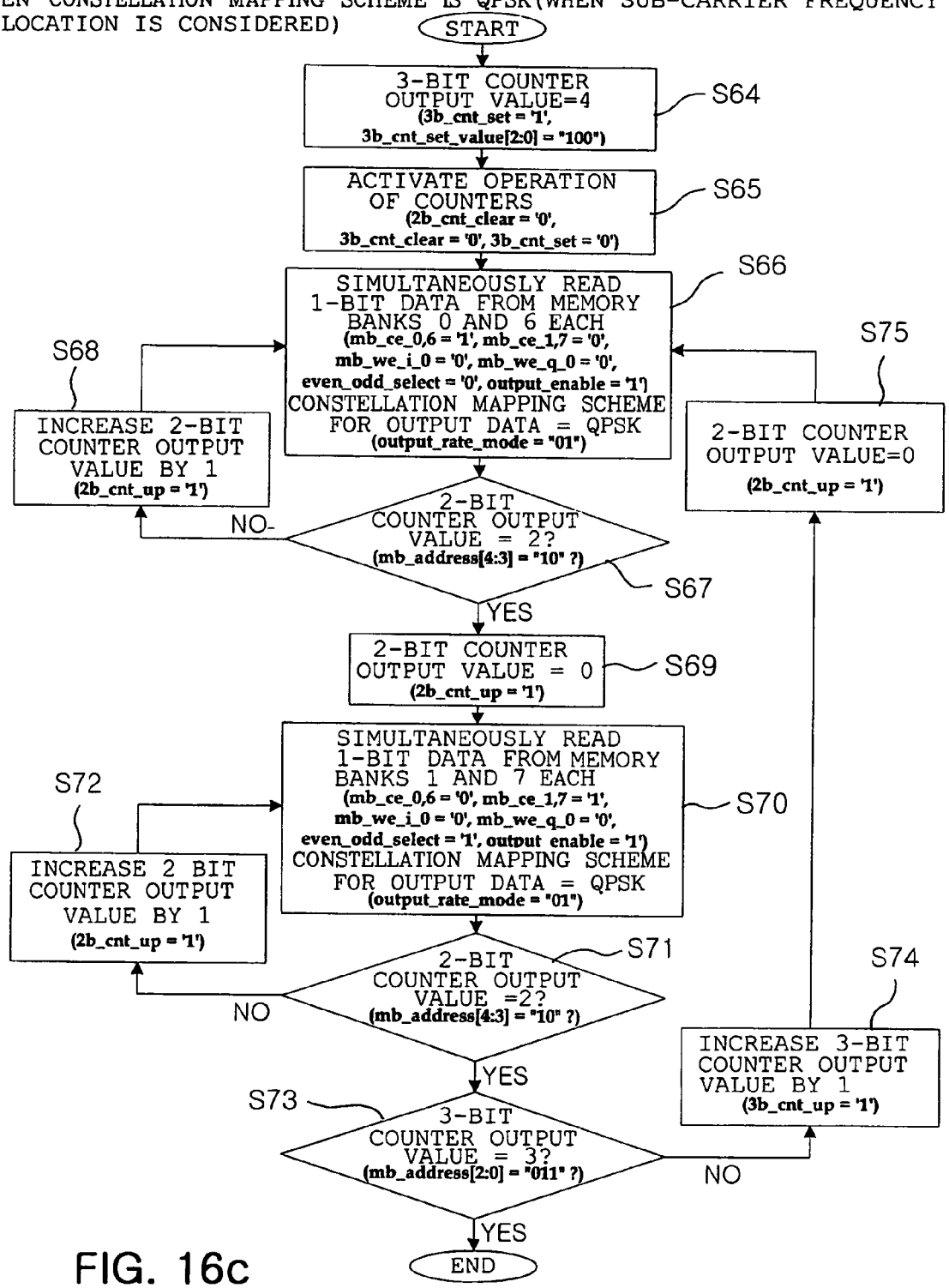

In FIG. 13, in the QPSK mode 113, the permutation processes are executed using the 24-bit memory banks 0, 1, 6 and 7, as shown in FIGS. 7a to 7j. A detailed operation performed in the QPSK mode is shown in FIGS. 16a to 16c. As shown in FIGS. 16a to 16c, the detailed operation of the QPSK mode may vary in the case where the sub-carrier frequency allocation is considered.

In FIG. 13, in the 16-QAM mode 114, the permutation processes are executed using the 24-bit memory banks 0, 1, 2, 3, 6, 7, 8 and 9, as shown in FIGS. 7a to 7j. A detailed operation performed in the 16-QAM mode is shown in FIGS. 17a to 17d. As shown in FIGS. 17a to 17d, the detailed operation of the 16-QAM mode may vary in the case where the sub-carrier frequency allocation is considered.

In FIG. 13, in the 64-QAM mode 115, the permutation processes are executed using all of the 24-bit memory banks, as shown in FIGS. 7a to 7j. A detailed operation performed in the 64-QAM mode is shown in FIGS. 18a to 18d. As shown in FIGS. 18a to 18d, the detailed operation of the 64-QAM mode may vary in the case where the sub-carrier frequency allocation is considered.

As shown in FIGS. 15a to 15c to 18a to 18d, the 2-bit binary counter 121 is operated so that its output value returns to 0 if the counter value is increased by 1 when the output value is 2. Further, the 3-bit binary counter 122 is operated so that its output value returns to 0 if a counter value is increased by 1 when the output value is 7.

Hereinafter, the operating process of the memory write/read control unit 110 according to the mapping schemes related to a data transmission rate of the present invention is described in detail, with reference to FIGS. 15a to 15c and 18a to 18d.

FIGS. 15a to 15c are flowcharts showing the operation of the memory write/read control unit 110 when a mapping scheme related to a data transmission rate is BPSK according to an embodiment of the present invention. FIG. 15a is a flowchart showing a process of controlling the writing data in the memory unit when a mapping scheme is BPSK. Referring to FIG. 15a, the operation of the 2-bit and 3-bit counters 121 and 122 is activated at step S10, and 1-bit data are simultaneously written in the memory banks 0 and 1 each at step S11. It is determined whether the output value of the 3-bit counter 122 is 7 at step S12. If the output value is not 7, the output value of the 3-bit counter 122 is increased by 1 at step S13, and then the process returns to step S11. In contrast, if the output value is 7, it is determined whether the output value of the 2-bit counter 121 is 2 at step S14. If it is determined that the output value of the 2-bit counter 121 is not 2, the output value of the 2-bit counter 121 is increased by 1 at step S15, the output value of the 3-bit counter 122 is set to 0 at step S16, and thereafter the process returns to step S11. If the output value of the 2-bit counter 121 is 2 at step S14, the counters 121 and 122 are initialized at step S17.

FIG. 15b is a flowchart of a process of controlling the reading of data from the memory unit and controlling the second permutation and output selection unit when a mapping scheme is BPSK. Referring to FIG. 15b, the operation of the 2-bit and 3-bit counters 121 and 122 is activated at step S18, and 1-bit data is read from the memory bank 0 at step S19. It is determined whether the output value of the 2-bit counter 121 is 2 at step S20. If the output value of the 2-bit counter 121 is not 2, the output value is increased by 1 at step S21, and then the process returns to step S19. If the output value of the 2-bit counter 121 is 2 at step S20, the output value is set to 0 at step S22, and 1-bit data is read from the memory bank 1 at step S23. Then, it is determined whether the output value of the 2-bit counter 121 is 2 at step S24. If the output value is not 2, the output value of the 2-bit counter 121 is increased by 1 at step S25, and then the process returns to step S23. If the output value of the 2-bit counter 121 is 2 at step S24, it is determined whether the output value of the 3-bit counter 122 is 7 at step S26. If the output value of the 3-bit counter 122 is 7, the process ends. In contrast, if the output value is not 7, the output value of the 3-bit counter 122 is increased by 1 at step S27, the output value of the 2-bit counter 121 is set to 0 at step S28, and thereafter the process returns to step S21.

FIG. 15c is a flowchart of a process of controlling the reading of data from the memory unit and controlling the second permutation and output selection unit when a mapping scheme is BPSK and sub-carrier frequency allocation is considered. Referring to FIG. 15c, the output value of the 3-bit counter 122 is set to 4 at step S29, and the operation of the counters 121 and 122 is activated at step S30. 1-bit data is read from the memory bank 0 at step S31, and it is determined whether the output value of the 2-bit counter 121 is 2 at step S32. If the output value is not 2, the output value of the 2-bit counter 121 is increased by 1 at step S33, and then the process returns to step S31. If the output value of the 2-bit counter is 2 at step S32, the output value is set to 0 at step S34, and one-bit data is read from the memory bank 1 at step S35. Thereafter, it is determined whether the output value of the 2-bit counter 121 is 2 at step S36. If the output value is not 2, the output value of the 2-bit counter 121 is increased by 1 at step S37, and then the process returns to step S35. If the output value of the 2-bit counter 121 is 2 at step S36, it is determined whether the output value of the 3-bit counter 122 is 3 at step S38. If the output value of the 3-bit counter 122 is 3, the process ends. If the output value of the 3-bit counter 122 is not 3, the output value is increased by 1 at step S39, the output value of the 2-bit counter 121 is set to 0 at step S40, and thereafter the process returns to step S31.

FIGS. 16a to 16c are flowcharts showing the operation of the memory write/read control unit when a mapping scheme related to a data transmission rate is QPSK according to an embodiment of the present invention. FIG. 16a is a flowchart showing a process of controlling the writing of data in the memory unit when a mapping scheme is QPSK. Referring to FIG. 16a, the operation of the 2-bit and 3-bit counters 121 and 122 is activated at step S41, and 1-bit data are simultaneously written in memory banks 0 and 1 each at step S42. It is determined whether the output value of the 3-bit counter 122 is 7 at step S43. If the output value is not 7, the output value of the 3-bit counter 122 is increased by 1 at step S44, and then the process returns to step S42. In contrast, if the output value of the 3-bit counter 122 is 7, the output value is set to 0 at step S45, and 1-bit data are simultaneously written in memory banks 6 and 7 each at step S46. Then, it is determined whether the output value of the 3-bit counter 122 is 7 at step S47. If the output value is not 7, the output value of the 3-bit counter 122 is increased by 1 at step S48, and then the process returns to step S46. If the output value of the 3-bit counter 122 is 7, it is determined whether the output value of the 2-bit counter 121 is 2 at step S49. If the output value is 2 at step S49, the counters 121 and 122 are initialized at step S50, and thereafter the process ends. If the output value of the 2-bit counter 121 is not 2, the output value is increased by 1 at step S51, the output value of the 3-bit counter 122 is set to 0 at step S52, and thereafter the process returns to step S42.

FIG. 16b is a flowchart of a process of controlling the reading of data from the memory unit and controlling the second permutation and output selection unit when a mapping scheme is QPSK. Referring to FIG. 16b, the operation of the 2-bit and 3-bit counters 121 and 122 is activated at step S53, and 1-bit data are simultaneously read from the memory banks 0 and 6 each at step S54. It is determined whether the output value of the 2-bit counter 121 is 2 at step S55. If the output value is not 2, the output value of the 2-bit counter 121 is increased by 1 at step S56, and then the process returns to step S54. If the output value of the 2-bit counter 121 is 2 at step S55, the output value is set to 0 at step S57, and 1-bit data are simultaneously read from memory banks 1 and 7 each at step S58. Then, it is determined whether the output value of the 2-bit counter 121 is 2 at step S59. If the output value is not 2, the output value of the 2-bit counter 121 is increased by 1 at step S60, and thereafter the process returns to step S58. If the output value of the 2-bit counter 121 is 2 at step S59, it is determined whether the output value of the 3-bit counter 122 is 7 at step S61. If the output value is 7, the process ends. In contrast, if the output value of the 3-bit counter 122 is not 7, the output value is increased by 1 at step S62, the output value of the 2-bit counter 121 is set to 0 at step S63, and then the process returns to step S54.

FIG. 16c is a flowchart of a process of controlling the reading of data from the memory unit and controlling the second permutation and output selection unit when a mapping scheme is QPSK and sub-carrier frequency allocation is considered. Referring to FIG. 16c, the output value of the 3-bit counter 122 is set to 4 at step S64, and the operation of the counters 121 and 122 is activated at step S65. 1-bit data are read from the memory banks 0 and 6 each at step S66, and it is determined whether the output value of the 2-bit counter 121 is 2 at step S67. If the output value of the 2-bit counter is not 2, the output value is increased by 1 at step S68, and then the process returns to step S66. If the output value is 2 at step S67, the output value of the 2-bit counter 121 is set to 0 at step S69, and 1-bit data are simultaneously read from the memory banks 1 and 7 each at step S70. Thereafter, it is determined whether the output value of the 2-bit counter 121 is 2 at step S71. If the output value is not 2, the output value of the 2-bit counter 121 is increased by 1 at step S72, and then the process returns to step S70. If the output value is 2 at step S71, it is determined whether the output value of the 3-bit counter 122 is 3 at step S73. If the output value is 3, the process ends. If the output value is not 3 at step S73, the output value of the 3-bit counter 122 is increased by 1 at step S74, the output value of the 2-bit counter 121 is set to 0 at step S75, and then the process returns to step S66.

Figure 17A:
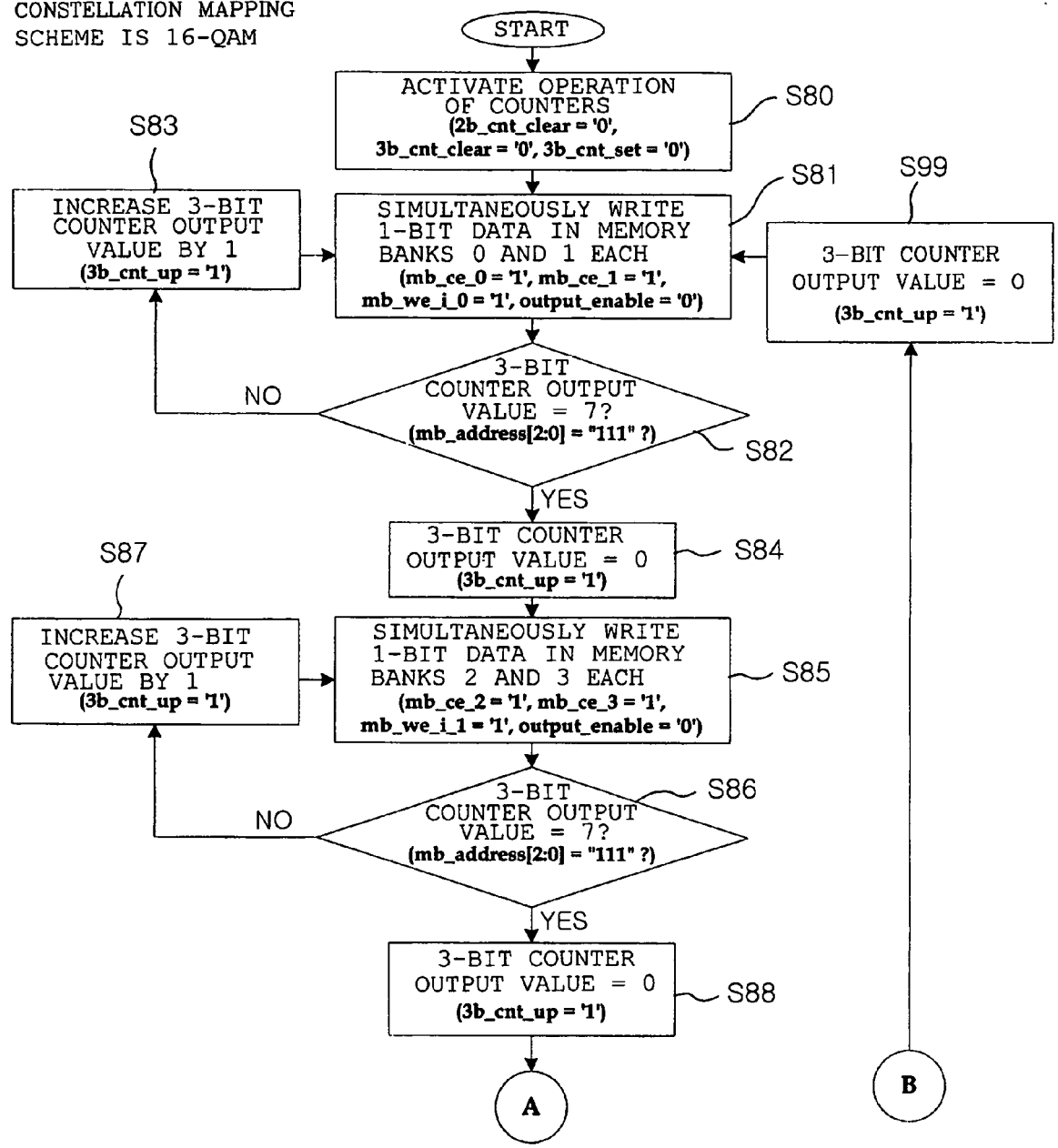
FIGS. 17a to 17d are flowcharts showing the operation of the memory write/read control unit when a constellation mapping scheme related to a data transmission rate is 16-QAM according to an embodiment of the present invention.
Figure 17B:
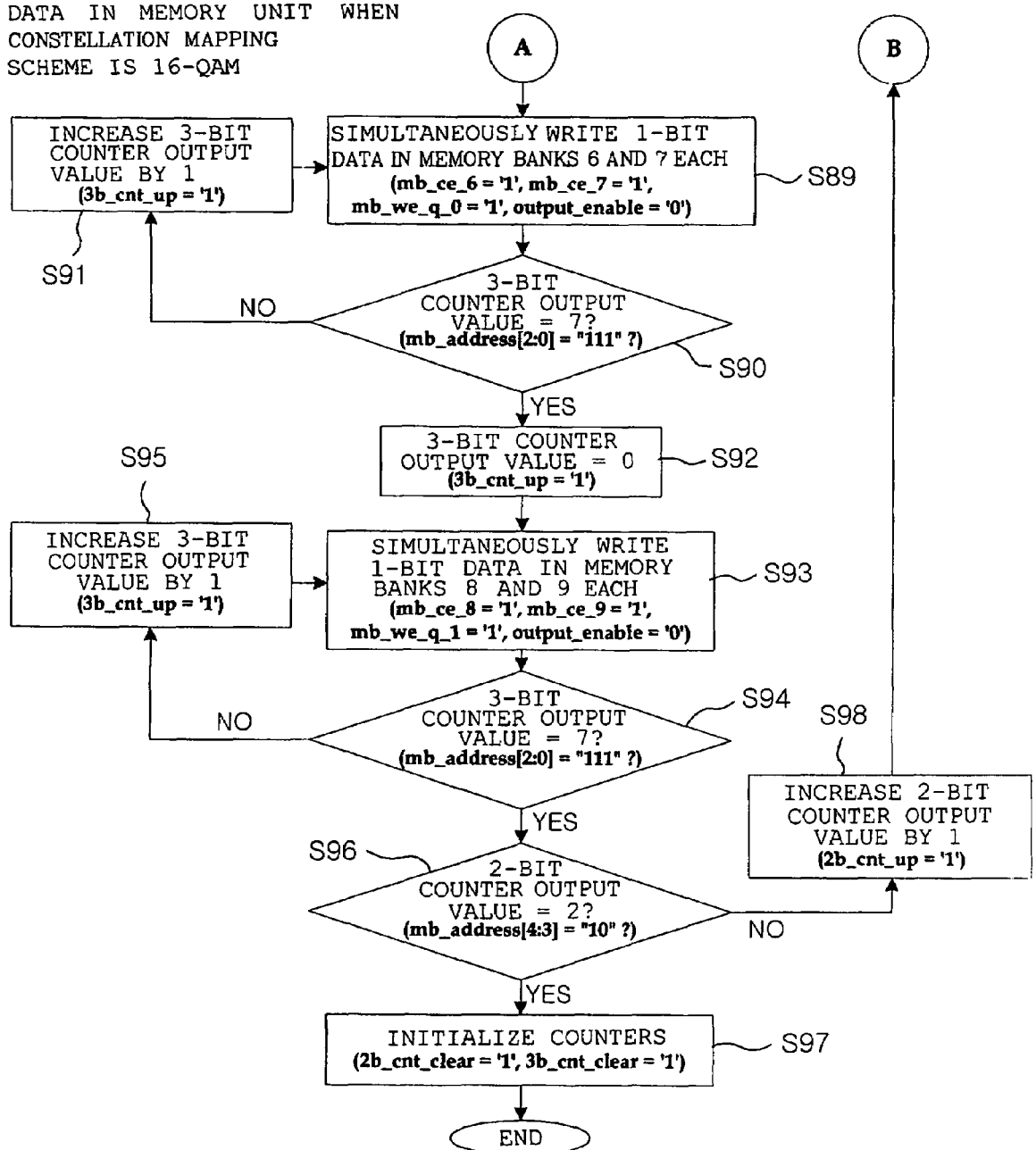

FIGS. 17a to 17d are flowcharts showing the operation of the memory write/read control unit when a mapping scheme related to a data transmission rate is 16-QAM according to an embodiment of the present invention. FIGS. 17a and 17b are flowcharts showing a process of controlling the writing of data in the memory unit when a mapping scheme is 16-QAM. Referring to FIGS. 17a and 17b, the operation of the 2-bit and 3-bit counters 121 and 122 is activated at step S80, and 1-bit data are simultaneously written in memory banks 0 and 1 each at step S81. It is determined whether the output value of the 3-bit counter 122 is 7 at step S82. If the output value is not 7, the output value of the 3-bit counter 122 is increased by 1 at step S83, and then the process returns to step S81. If the output value of the 3-bit counter 122 is 7, the output value is set to 0 at step S84, and 1-bit data are simultaneously written in memory banks 2 and 3 each at step S85. Then, it is determined whether the output value of the 3-bit counter 122 is 7 at step S86. If the output value is not 7, the output value of the 3-bit counter 122 is increased by 1 at step S87, and then the process returns to step S85. In contrast, if the output value of the 3-bit counter 122 is 7, the output value is set to 0 at step S88, and 1-bit data are simultaneously written in the memory banks 6 and 7 each at step S89. Then, it is determined whether the output value of the 3-bit counter 122 is 7 at step S90. If the output value is not 7, the output value of the 3-bit counter 122 is increased by 1 at step S91, and then the process returns to step S89. If the output value of the 3-bit counter 122 is 7 at step S90, the output value is set to 0 at step S92, and 1-bit data are simultaneously written in memory banks 8 and 9 each at step S93. Then, it is determined whether the output value of the 3-bit counter 122 is 7 at step S94. If the output value is not 7, the output value of the 3-bit counter 122 is increased by 1 at step S95, and then the process returns to step S93. If the output value of the 3-bit counter 122 is 7, it is determined whether the output value of the 2-bit counter 121 is 2 at step S96. If the output value of the 2-bit counter 121 is not 2, the output value is increased by 1 at step S98, the output value of the 3-bit counter 122 is set to 0 at step S99, and then the process returns to step S81. If the output value of the 2-bit counter 121 is 2 at step S96, the counters 121 and 122 are initialized at step S97, and the process ends.

Figure 17C:
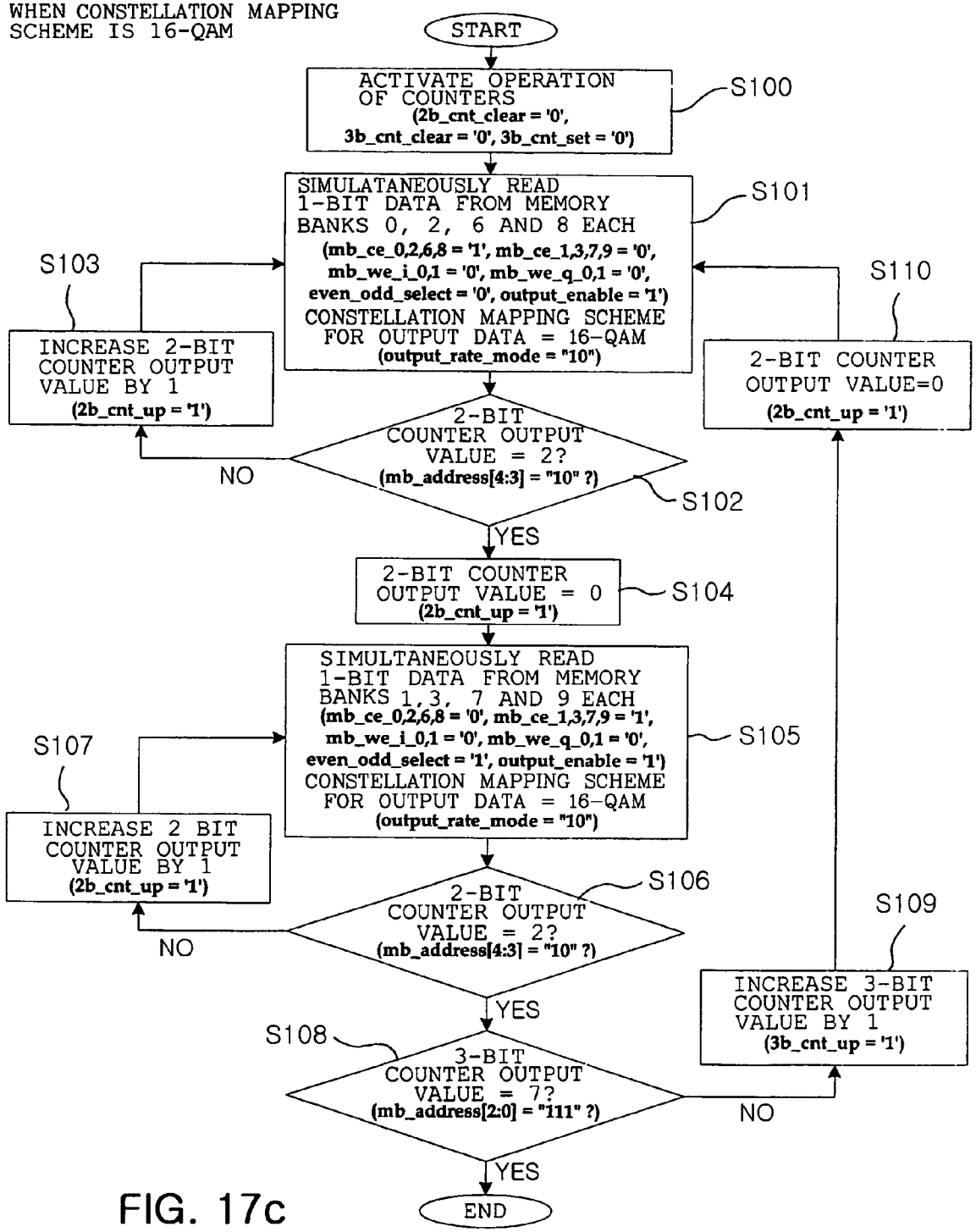

FIG. 17c is a flowchart of a process of controlling the reading of data from the memory unit and controlling the second permutation and output selection unit when a mapping scheme is 16-QAM. Referring to FIG. 17c, the operation of the 2-bit and 3-bit counters 121 and 122 is activated at step S100, and 1-bit data are simultaneously read from memory banks 0, 2, 6 and 8 each at step S101. It is determined whether the output value of the 2-bit counter 121 is 2 at step S102. If the output value is not 2, the output value of the 2-bit counter 121 is increased by 1 at step S103, and then the process returns to step S101. If the output value of the 2-bit counter 121 is 2 at step S102, the output value is set to 0 at step S104, and 1-bit data are simultaneously read from memory banks 1, 3, 7 and 9 each at step S105. Then, it is determined whether the output value of the 2-bit counter 121 is 2 at step S106. If the output value is not 2, the output value of the 2-bit counter 121 is increased by 1 at step S107, and then the process returns to step S105. If the output value of the 2-bit counter 121 is 2 at step S106, it is determined whether the output value of the 3-bit counter 122 is 7 at step S108. If the output value is 7, the process ends, while if the output value is not 7, the output value of the 3-bit counter 122 is increased by 1 at step S109, the output value of the 2-bit counter 121 is set to 0 at step S110, and then the process returns to step S101.

Figure 17D:
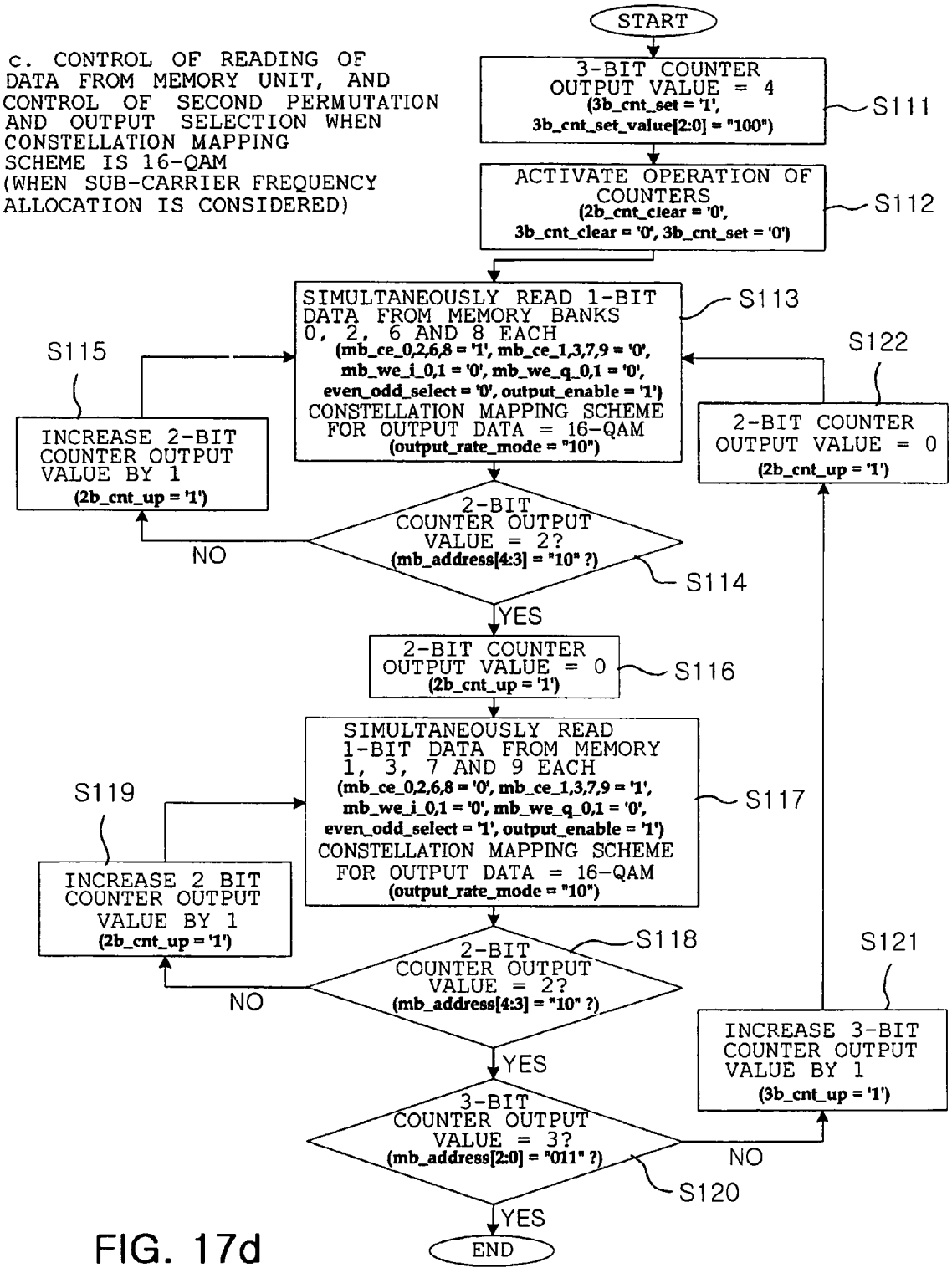

FIG. 17d is a flowchart of a process of controlling the reading of data from the memory unit and controlling the second permutation and output selection unit when a mapping scheme is 16-QAM and sub-carrier frequency allocation is considered. Referring to FIG. 17d, the output value of the 3-bit counter 122 is set to 4 at step S111, and the operation of the counters 121 and 122 is activated at step S112. 1-bit data are simultaneously read from the memory banks 0, 2, 6 and 8 each at step S113, and it is determined whether the output value of the 2-bit counter 121 is 2 at step S114. If the output value of the 2-bit counter 121 is not 2, the output value is increased by 1 at step S115, and then the process returns to step S113. If the output value is 2 at step S114, the output value of the 2-bit counter 121 is set to 0 at step S116, and 1-bit data are simultaneously read from the memory banks 1, 3, 7 and 9 each at step S117. Thereafter, it is determined whether the output value of the 2-bit counter 121 is 2 at step S118. If the output value is not 2, the output value of the 2-bit counter 121 is increased by 1 at step S119, and then the process returns to step S117. If the output value of the 2-bit counter 121 is 2 at step S118, it is determined whether the output value of the 3-bit counter 122 is 3 at step S120. If the output value of the 3-bit counter 122 is 3 at step S120, the process ends. If the output value is not 3, the output value of the 3-bit counter 122 is increased by 1 at step S121, the output value of the 2-bit counter 121 is set to 0 at step S122, and then the process returns to step S113.

Figure 18A:
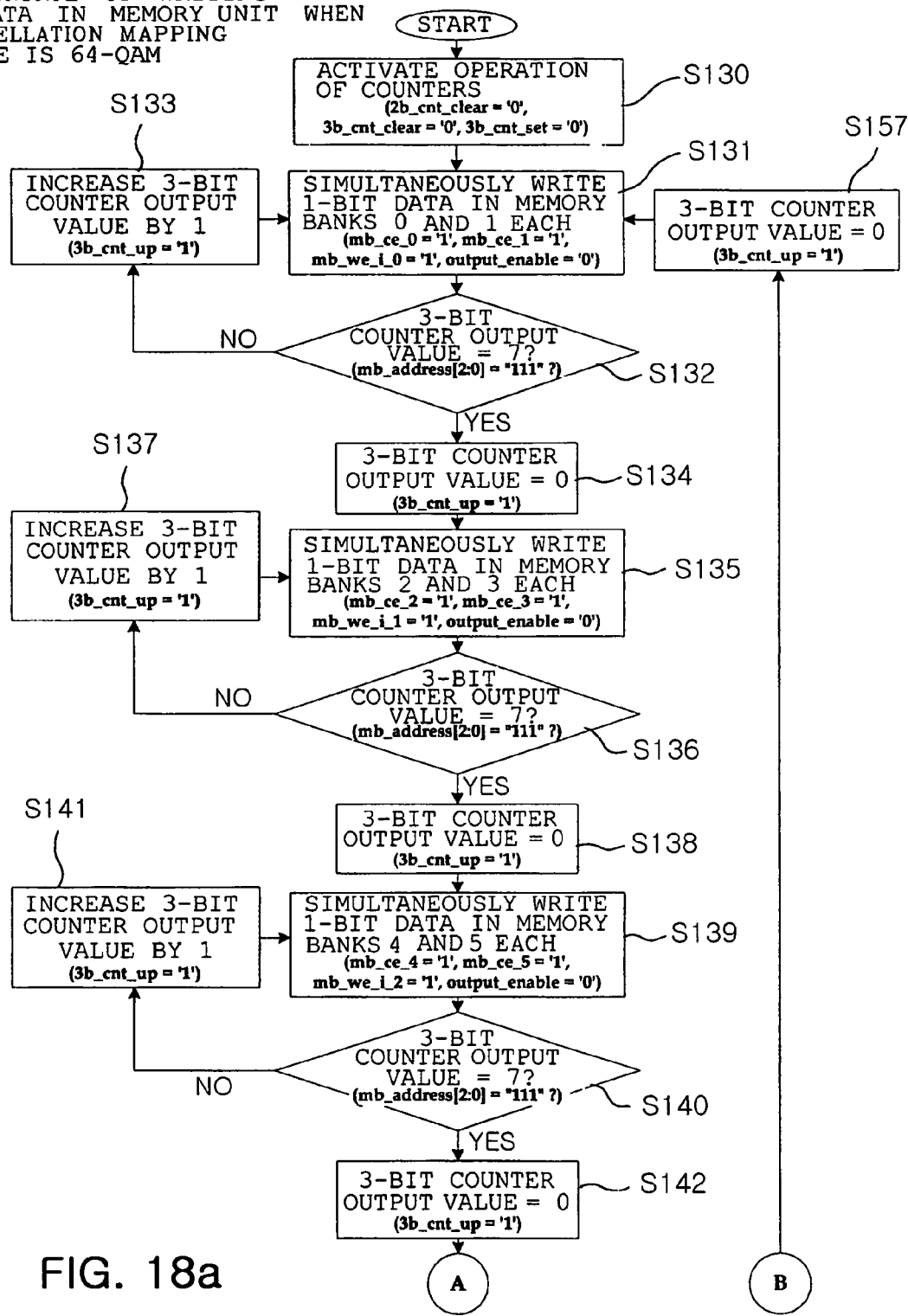
FIGS. 18a to 18d are flowcharts showing the operation of the memory write/read control unit when a constellation mapping scheme related to a data transmission rate is 64-QAM according to an embodiment of the present invention.
Figure 18B:
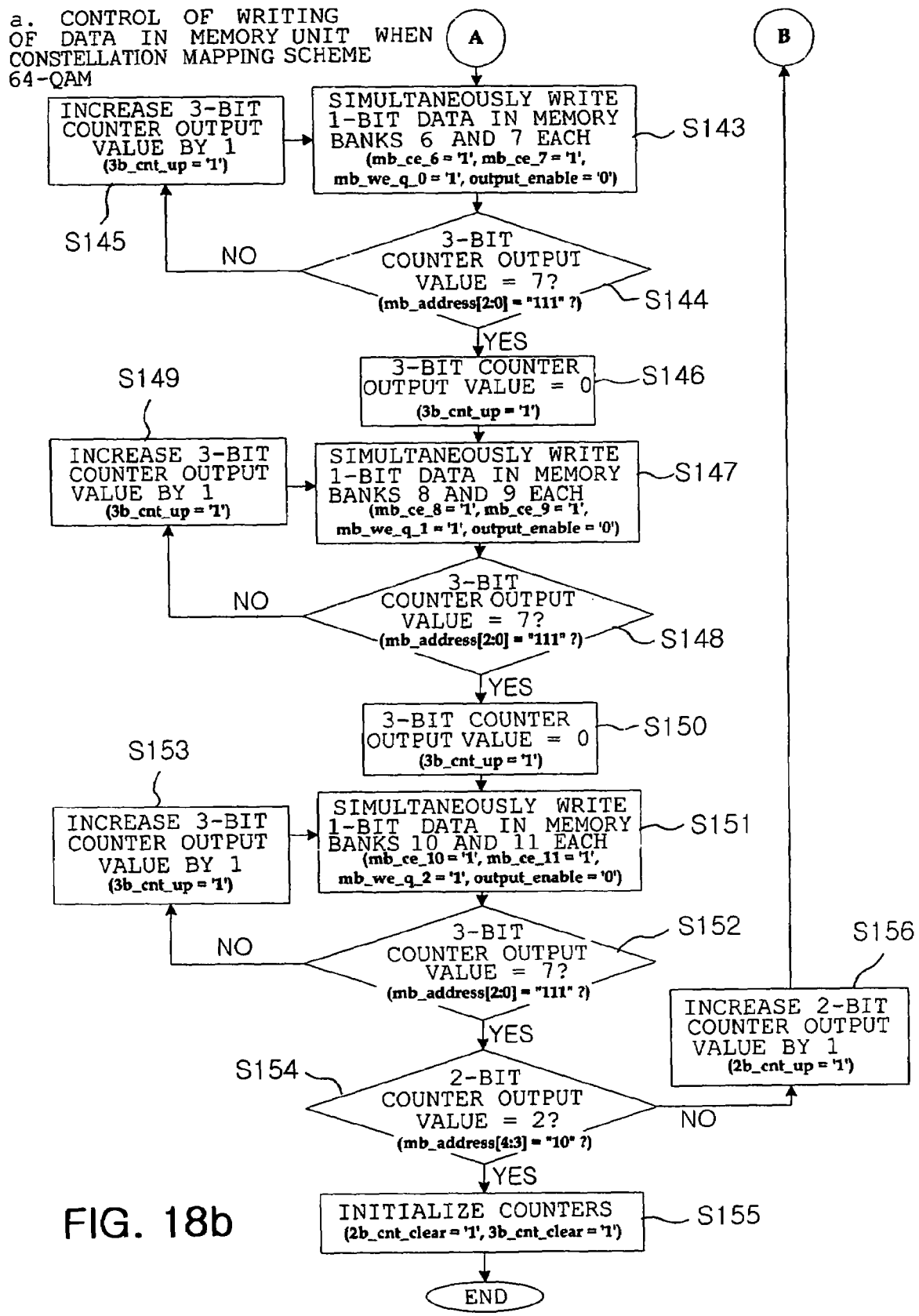

FIGS. 18a to 18d are flowcharts showing the operation of the memory write/read control unit when a mapping scheme related to a data transmission rate is 64-QAM according to an embodiment of the present invention. FIGS. 18a and 18b are flowcharts showing a process of controlling the writing of data in the memory unit when a mapping scheme is 64-QAM. Referring to FIGS. 18a and 18b, the operation of the 2-bit and 3-bit counters 121 and 122 is activated at step S130, and 1-bit data are simultaneously written in memory banks 0 and 1 each at step S131. It is determined whether the output value of the 3-bit counter 122 is 7 at step S132. If the output value is not 7, the output value of the 3-bit counter 122 is increased by 1 at step S133, and then the process returns to step S131. If the output value is 7, the output value of the 3-bit counter 122 is set to 0 at step S134, and 1-bit data are simultaneously written in memory banks 2 and 3 each at step S135. Then, it is determined whether the output value of the 3-bit counter 122 is 7 at step S136. If the output value is not 7, the output value of the 3-bit counter 122 is increased by 1 at step S137, and then the process returns to step S135. In contrast, if the output value is 7, the output value of the 3-bit counter 122 is set to 0 at step S138. Then, 1-bit data are simultaneously written in memory banks 4 and 5 each at step S139. Then, it is determined whether the output value of the 3-bit counter 122 is 7 at step S140. If the output value is not 7, the output value of the 3-bit counter 122 is increased by 1 at step S141, and then the process returns to step S139. If the output value of the 3-bit counter 122 is 7 at step S140, the output value is set to 0 at step S142, and 1-bit data are simultaneously written in memory banks 6 and 7 each at step S143. Then, it is determined whether the output value of the 3-bit counter 122 is 7 at step S144. If the output value is not 7, the output value of the 3-bit counter 122 is increased by 1 at step S145, and then the process returns to step S143. If the output value of the 3-bit counter 122 is 7, the output value is set to 0 at step S146, and 1-bit data are simultaneously written in memory banks 8 and 9 each at step S147. Then, it is determined whether the output value of the 3-bit counter 122 is 7 at step S148. If the output value of the 3-bit counter 122 is not 7, the output value is increased by 1 at step S149, and then the process returns to step S147. If the output value is 7 at step S148, the output value of the 3-bit counter 122 is set to 0 at step S150, and 1-bit data are simultaneously written in memory banks 10 and 11 each at step S151. Then, it is determined whether the output value of the 3-bit counter 122 is 7 at step S152. If the output value is not 7, the output value of the 3-bit counter 122 is increased by 1 at step S153, and then the process returns to step S151. If the output value of the 3-bit counter 122 is 7, it is determined whether the output value of the 2-bit counter 121 is 2 at step S154. If the output value is not 2, the output value of the 2-bit counter 121 is increased by 1 at step S156, the output value of the 3-bit counter 122 is set to 0 at step S157, and thereafter the process returns to step S131. If the output value of the 2-bit counter 121 is 2, the counters 121 and 122 are initialized at step S155, and then the process ends.

Figure 18C:
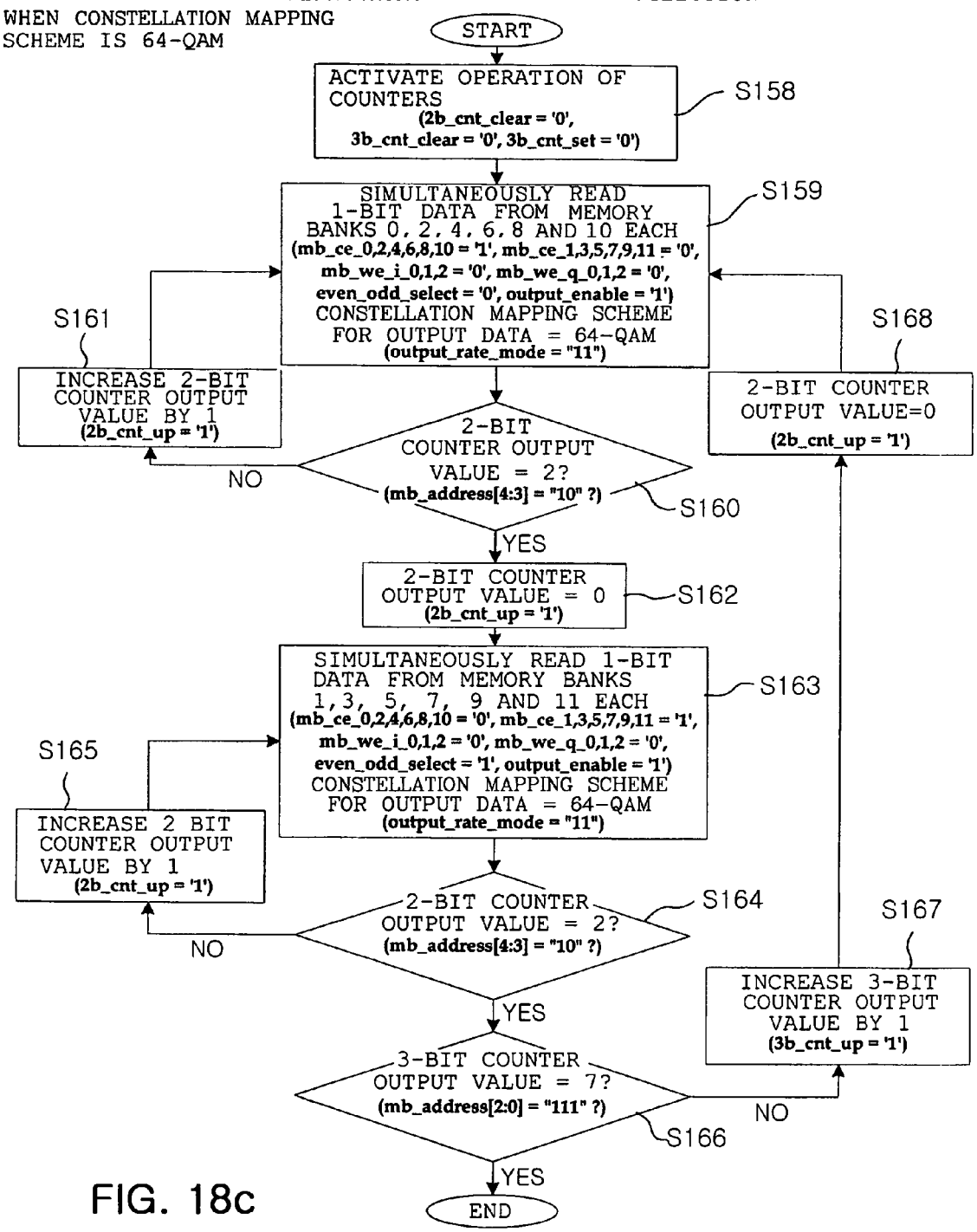

FIG. 18c is a flowchart of a process of controlling the reading of data from the memory unit and controlling the second permutation and output selection unit when a mapping scheme is 64-QAM. Referring to FIG. 18c, the operation of the 2-bit and 3-bit counters 121 and 122 is activated at step S158, and 1-bit data are simultaneously read from memory banks 0, 2, 4, 6, 8 and 10 each at step S159. It is determined whether the output value of the 2-bit counter 121 is 2 at step S160. If the output value is not 2, the output value of the 2-bit counter 121 is increased by 1 at step S161, and then the process returns to step S159. If the output value is 2 at step S160, the output value of the 2-bit counter 121 is set to 0 at step S162, and then 1-bit data are simultaneously read from memory banks 1, 3, 5, 7, 9 and 11 each at step S163. Then, it is determined whether the output value of the 2-bit counter 121 is 2 at step S164. If the output value is not 2, the output value of the 2-bit counter 121 is increased by 1 at step S165, and then the process returns to step S163. If the output value is 2 at step S164, it is determined whether the output value of the 3-bit counter 122 is 7 at step S166. If the output value is 7, the process ends, while if the output value is not 7, the output value of the 3-bit counter 122 is increased by 1 at step S167, the output value of the 2-bit counter 121 is set to 0 at step S168, and then the process returns to step S159.

Figure 18D:
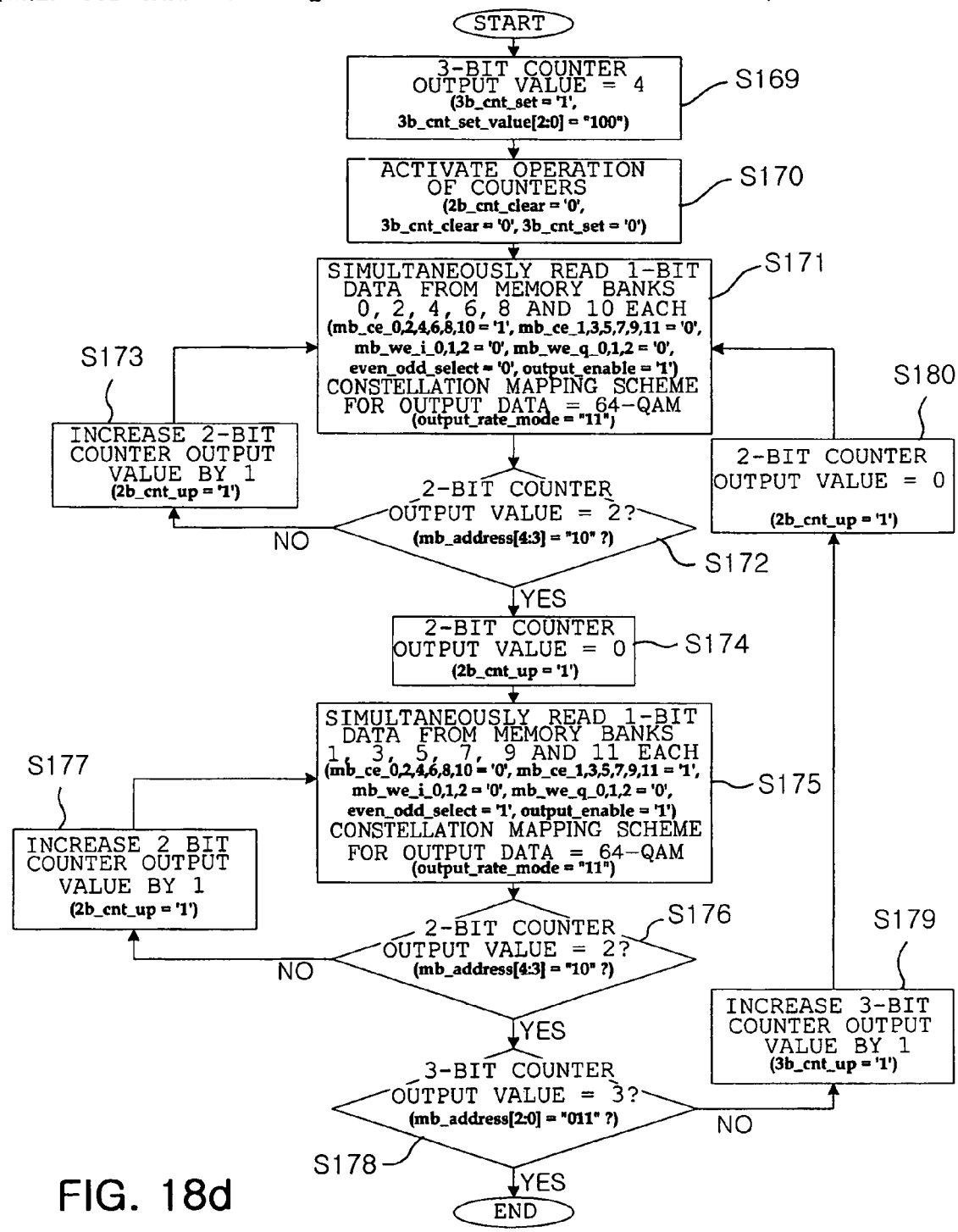

FIG. 18d is a flowchart of a process of controlling the reading of data from the memory unit and controlling the second permutation and output selection unit when a mapping scheme is 64-QAM and sub-carrier frequency allocation is considered. Referring to FIG. 18d, the output value of the 3-bit counter 122 is set to 4 at step S169, and the operation of the counters 121 and 122 is activated at step S170. 1-bit data are simultaneously read from memory banks 0, 2, 4, 6, 8 and 10 each at step S171, and it is determined whether the output value of the 2-bit counter 121 is 2 at step S172. If the output value of the 2-bit counter 121 is not 2, the output value is increased by 1 at step S173, and then the process returns to step S171. If the output value is 2 at step S172, the output value of the 2-bit counter 121 is set to 0 at step S174, and 1-bit data are simultaneously read from memory banks 1, 3, 5, 7, 9 and 11 each at step S175. Thereafter, it is determined whether the output value of the 2-bit counter 121 is 2 at step S176. If the output value is not 2, the output value of the 2-bit counter 121 is increased by 1 at step S177, and then the process returns to step S175. If the output value is 2 at step S176, it is determined whether the output value of the 3-bit counter 122 is 3 at step S178. If the output value is 3, the process ends. If the output value is not 3 at step S178, the output value of the 3-bit counter 122 is increased by 1 at step S179, the output value of the 2-bit counter 121 is set to 0 at step S180, and then the process returns to step S171.

The above detailed descriptions and drawings show the technical spirit of an interleaving apparatus and method for an orthogonal frequency division multiplexing transmitter according to the present invention. Although the preferred embodiments of the present invention have been disclosed for illustrative purposes, the present invention is not limited to the embodiments. In particular, as embodiments of the present invention, memory banks, input/output data and various signals shown in the drawings can be applied to the present invention, but those skilled in the art will appreciate that other embodiments can be implemented.

Further, those skilled in the art will appreciate that various modifications, additions and substitutions are possible, without departing from the scope and spirit of the invention as disclosed in the accompanying claims. Therefore, the spirit and scope of the present invention would be defined by the accompanying claims, not the detailed description and the drawings.

As described above, the present invention provides an interleaving apparatus and method for an OFDM transmitter, which separates output data into inphase components and quadrature components, determines the number of bits, output in parallel, according to a mapping scheme, and outputs the determined bits when the data are output from the interleaving apparatus, thus omitting processes that may be unnecessarily executed, such as data rearrangement for mapping or data rearrangement according to sub-carrier frequency allocation.

Further, the present invention is advantageous in that first and second permutation processes are separated, so that bits are output from memory in parallel according to a mapping scheme during the first permutation process, and the positions of output data bits are rearranged during the second permutation process, thus simplifying and facilitating the design of a required controller.

Moreover, the present invention is advantageous in that a 24-bit memory bank is implemented with the unit of memory, so that an interleaving apparatus enabling systematic extension or reduction can be implemented.

What is claimed is:

1. An interleaving apparatus for an orthogonal frequency division multiplexing transmitter, comprising:
   a memory unit including a plurality of memory banks each having memory cells arranged in an N×M matrix structure, the memory banks being capable of being independently controlled so that data can be written or read in or from the memory banks;
   a memory write/read control unit for generating control signals to write/read data in/from the memory unit, according to a constellation mapping scheme related to a data transmission rate, and outputs the control signals to the memory unit;
   a memory access address generation unit for generating a memory access address used to write/read data in/from the memory unit in response to the memory write/read control signals; and
   a second permutation and output selection unit for rearranging positions of data bits output from the memory unit and outputting the position-rearranged data bits.

2. The interleaving apparatus according to claim 1, wherein the memory unit comprises a plurality of 24-bit memory banks.

3. The interleaving apparatus according to claim 1 or 2, wherein the memory unit comprises at least 12 memory banks.

4. The interleaving apparatus according to claim 1, wherein each of the memory banks receives or outputs data on a 1-bit-at-a-time basis.

5. The interleaving apparatus according to claim 1, wherein each of the memory banks controls write/read operations in response to activation signals of the write/read control signals output from the memory write/read control unit.

6. The interleaving apparatus according to claim 1, wherein the data input to the memory unit have a 2-bit parallel structure.

7. The interleaving apparatus according to claim 1, wherein the memory write/read control unit receives signals indicating the data transmission rate and a valid interval of the input data and generates the control signals to write/read data existing in the valid interval.

8. The interleaving apparatus according to claim 1, wherein the memory access address generation unit generates an n-bit memory access address, upper k bits of which indicate a column of each memory cell and lower n-k bits of which indicate a row of each memory cell.

9. The interleaving apparatus according to claim 8, wherein n is 5 and k is 2.

10. The interleaving apparatus according to claim 1, wherein the second permutation and output selection unit comprises:
    a second permutation unit for rearranging the positions of data bits output from the memory unit; and
    an output selection unit for outputting the position-rearranged data bits and signals indicating a data transmission rate and a valid interval of the output data, and outputting valid data according to the data transmission rate and the valid interval.

11. The interleaving apparatus according to claim 10, wherein the second permutation unit includes 12 bit input ports, which are classified into an inphase block and a quadrature block, each including 6-bit input ports that receive 6-bit parallel data, the 6-bit parallel data corresponding to each block being divided into two 3-bit groups and being input to an odd part and an even part, respectively.

12. The interleaving apparatus according to claim 10, wherein the second permutation unit outputs 6-bit parallel data, which are classified into an inphase block and a quadrature block, each having 3 bits.

13. The interleaving apparatus according to claim 10, wherein the second permutation unit selects one of data output corresponding to an odd part and data output corresponding to an even part in response to an odd/even part distinguishing signal generated by the memory write/read control unit, and outputs the selected data.

14. The interleaving apparatus according to claim 10, wherein the output selection unit is operated so that, if a constellation mapping scheme related to a data transmission rate of the output data is BPSK, valid data are output in series on a 1-bit-at-a-time basis, if a constellation mapping scheme is QPSK, valid data are output in parallel on a 2-bits-at-a-time basis, if a constellation mapping scheme is 16-QAM, valid data are output in parallel on a 4-bits-at-a-time basis, and if a constellation mapping scheme is 64-QAM, valid data are output in parallel on a 6-bits-at-a-time basis.

15. An interleaving method for an orthogonal frequency division multiplexing transmitter, the transmitter including a memory write/read control unit and a memory access address generation unit and writing/reading data in/from a memory unit including a plurality of memory banks each having memory cells arranged in a matrix structure, the memory banks being capable of being independently controlled so that data input from a convolution encoder can be written or read in or from the memory banks, the method comprising the steps of:

a) the memory write/read control unit generating a control signal to write the input data in a corresponding memory bank in response to data transmission rate and valid interval indication signals for the input data transmitted from the convolution encoder;

b) the memory access address generation unit generating a memory access address to access the memory bank, in which the input data are to be written, in response to the write control signal for the memory bank generated by the memory write/read control unit;

c) writing the input data in a memory bank corresponding to the memory access address in response to the write control signal generated by the memory write/read control unit;

d) the memory write/read control unit generating a control signal to read data, written in the memory bank according to the data transmission rate, and data transmission rate and valid interval indication signals for output data when the data are read from the memory bank;

e) the memory access address generation unit generating a memory access address to access the memory bank, from which output data are to be read, in response to the read control signal;

f) reading the output data from the memory bank in response to the read control signal and the memory access address;

g) rearranging positions of output data read from the memory bank; and h) outputting valid data among the position-rearranged output data in response to the data transmission rate and valid interval indication signals for the output data.

16. The interleaving method according to claim 15, wherein the step a) is performed so that the memory write/read control unit generates a control signal to write the input data in 24-bit memory banks.

17. The interleaving method according to claim 15, wherein the step a) is performed so that the memory write/read control unit generates a control signal to write the input data in at least 12 memory banks.

18. The interleaving method according to claim 15, wherein the data input/output to/from the memory bank are 1-bit data.

19. The interleaving method according to claim 15, wherein the data, input to the memory unit, have a 2-bit parallel input structure.

20. The interleaving method according to claim 15, wherein the step b) is performed to generate the memory access address implemented with an n-bit signal, upper k bits of which indicate a column of each memory cell and lower n-k bits of which indicate a row of each memory cell.

21. The interleaving method according to claim 20, wherein n is 5 and k is 2.

22. The interleaving method according to claim 15, wherein the step g) is performed to output 6-bit parallel data, the 6-bit parallel data being classified into an inphase block and a quadrature block, each having 3 bits.

23. The interleaving method according to claim 15, wherein the step g) is performed so that one of data output corresponding to an odd part and data output corresponding to an even part is selected in response to an odd/even part distinguishing signal generated by the memory write/read control unit, and the selected data are output.

24. The interleaving method according to claim 15, wherein the step h) is performed so that, if a constellation mapping scheme related to a data transmission rate of the output data is BPSK, valid data are output in series on a 1-bit-at-a-time basis, if a constellation mapping scheme is QPSK, valid data are output in parallel on a 2-bits-at-a-time basis, if a constellation mapping scheme is 16-QAM, valid data are output in parallel on a 4-bits-at-a-time basis, and if a constellation mapping scheme is 64-QAM, valid data are output in parallel on a 6-bits-at a time-basis.

25. The interleaving method according to claim 15, wherein the step h) comprises the step of outputting the data transmission rate and valid interval indication signals for the output data.

* * * * *